(12) United States Patent
Ikeda et al.

(10) Patent No.: US 11,990,778 B2
(45) Date of Patent: May 21, 2024

(54) SECONDARY BATTERY PROTECTION CIRCUIT AND SECONDARY BATTERY ANOMALY DETECTION SYSTEM

(71) Applicant: SEMICONDUCTOR ENERGY LABORATORY CO., LTD., Atsugi (JP)

(72) Inventors: Takayuki Ikeda, Kanagawa (JP); Munehiro Kozuma, Kanagawa (JP); Takanori Matsuzaki, Kanagawa (JP); Ryota Tajima, Kanagawa (JP); Shunpei Yamazaki, Tokyo (JP); Yuki Okamoto, Kanagawa-ken (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 682 days.

(21) Appl. No.: 17/258,957

(22) PCT Filed: Jun. 27, 2019

(86) PCT No.: PCT/IB2019/055428
§ 371 (c)(1),
(2) Date: Jan. 8, 2021

(87) PCT Pub. No.: WO2020/012284
PCT Pub. Date: Jan. 16, 2020

(65) Prior Publication Data
US 2021/0126473 A1    Apr. 29, 2021

(30) Foreign Application Priority Data

Jul. 10, 2018 (JP) .................................. 2018-131018
Jul. 27, 2018 (JP) .................................. 2018-141302

(51) Int. Cl.
*H02J 7/00* (2006.01)
*H01M 10/42* (2006.01)

(52) U.S. Cl.
CPC ....... *H02J 7/0031* (2013.01); *H01M 10/4235* (2013.01); *H02J 7/0036* (2013.01)

(58) Field of Classification Search
CPC ..................................................... H02J 7/0031
(Continued)

(56) References Cited

U.S. PATENT DOCUMENTS 5,481,730 A  1/1996  Brown et al.
5,528,032 A  6/1996  Uchiyama
(Continued)

FOREIGN PATENT DOCUMENTS

JP        09-017458 A    1/1997
JP        2007-527597    9/2007
(Continued)

*Primary Examiner* — Yalkew Fantu
(74) *Attorney, Agent, or Firm* — NIXON PEABODY LLP; Jeffrey L. Costellia

(57) ABSTRACT

Safety is secured in such a manner that an anomaly of a secondary battery is detected with a protection circuit, for example, a phenomenon that lowers the safety of a secondary battery, particularly a micro short circuit, is detected early, and users are warned or the use of the secondary battery is stopped. A secondary battery protection circuit includes a first memory circuit electrically connected to a secondary battery, a comparison circuit electrically connected to the first memory circuit, a second memory circuit electrically connected to the comparison circuit, and a power-off switch electrically connected to the second memory circuit. The power-off switch is electrically connected to the secondary battery, and the first memory circuit includes a first transistor including an oxide semiconductor and retains a voltage value of the secondary battery in an analog manner.

13 Claims, 24 Drawing Sheets

(58) Field of Classification Search
USPC .................................................. 320/116
See application file for complete search history.

(56) References Cited

U.S. PATENT DOCUMENTS

| | | | |
|---|---|---|---|
| 5,617,010 A | 4/1997 | Higashijima et al. |
| 5,731,856 A | 3/1998 | Kim et al. |
| 5,744,864 A | 4/1998 | Cillessen et al. |
| 5,936,384 A | 8/1999 | Fujiwara et al. |
| 5,965,998 A | 10/1999 | Whiting et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,019,420 B2 | 3/2006 | Kogan et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,073,147 B2 | 7/2006 | Ikeda et al. |
| 7,105,868 B2 | 9/2006 | Nause et al. |
| 7,176,655 B2 | 2/2007 | Kogan et al. |
| 7,179,561 B2 | 2/2007 | Niu et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,425,814 B2 | 9/2008 | Tsuchiya et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,528,580 B2 | 5/2009 | Sim |
| 7,629,771 B2 | 12/2009 | Li et al. |
| 7,674,650 B2 | 3/2010 | Akimoto et al. |
| 7,732,819 B2 | 6/2010 | Akimoto et al. |
| 7,745,047 B2 | 6/2010 | Zhamu et al. |
| 7,768,232 B2 | 8/2010 | Kogan et al. |
| 7,834,590 B2 | 11/2010 | Genin et al. |
| 7,842,432 B2 | 11/2010 | Niu et al. |
| 7,907,902 B2 | 3/2011 | Kato et al. |
| 7,939,218 B2 | 5/2011 | Niu |
| 7,977,007 B2 | 7/2011 | Niu et al. |
| 7,977,013 B2 | 7/2011 | Niu et al. |
| 8,049,469 B2 | 11/2011 | Kim |
| 8,159,193 B2 | 4/2012 | Kato et al. |
| 8,169,188 B2 | 5/2012 | Kogan et al. |
| 8,278,011 B2 | 10/2012 | Zhu et al. |
| 8,289,753 B2 | 10/2012 | Yamazaki et al. |
| 8,355,231 B2 | 1/2013 | Lee et al. |
| 8,358,202 B2 | 1/2013 | Takahashi |
| 8,429,634 B2 | 4/2013 | Dembo et al. |
| 8,482,261 B2 | 7/2013 | Kato et al. |
| 8,659,934 B2 | 2/2014 | Yamazaki et al. |
| 8,698,219 B2 | 4/2014 | Sekine et al. |
| 8,811,067 B2 | 8/2014 | Yamazaki et al. |
| 8,977,203 B2 | 3/2015 | Kato et al. |
| 9,160,195 B2 | 10/2015 | Takahashi et al. |
| 9,231,283 B2 | 1/2016 | Ikeuchi et al. |
| 9,331,510 B2 | 5/2016 | Koyama |
| 9,590,215 B2 | 3/2017 | Kim |
| 9,755,442 B2 | 9/2017 | Kageyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0157378 A1 | 8/2004 | Ikeda et al. |
| 2005/0017302 A1 | 1/2005 | Hoffman |
| 2005/0156574 A1 | 7/2005 | Sato et al. |
| 2005/0189919 A1 | 9/2005 | Tsuchiya et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0118815 A1 | 6/2006 | Otremba et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0214721 A1 | 9/2006 | Ikeda et al. |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0188950 A1 | 8/2007 | Liu et al. |
| 2007/0194379 A1 | 8/2007 | Hosono et al. |
| 2007/0212596 A1 | 9/2007 | Nebrigic et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254296 A1 | 10/2008 | Handa et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258177 A1 | 10/2008 | Ikeda et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0085516 A1 | 4/2009 | Emori et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0230923 A1 | 9/2009 | Hoffman et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0143798 A1 | 6/2010 | Zhamu et al. |
| 2010/0176337 A1 | 7/2010 | Zhamu et al. |
| 2010/0211765 A1 | 8/2010 | Amidi et al. |
| 2010/0237829 A1 | 9/2010 | Tatebayashi et al. |
| 2010/0248034 A1 | 9/2010 | Oki et al. |
| 2010/0330421 A1 | 12/2010 | Cui et al. |

(56) References Cited

U.S. PATENT DOCUMENTS

| | | |
|---|---|---|
| 2011/0012067 A1 | 1/2011 | Kay |
| 2011/0075322 A1 | 3/2011 | Kuriki et al. |
| 2011/0092050 A1 | 4/2011 | Shimomura et al. |
| 2011/0110145 A1 | 5/2011 | Yamazaki et al. |
| 2011/0111303 A1 | 5/2011 | Kung et al. |
| 2011/0121240 A1 | 5/2011 | Amine et al. |
| 2011/0121887 A1 | 5/2011 | Kato et al. |
| 2011/0133706 A1 | 6/2011 | Takahashi et al. |
| 2011/0159372 A1 | 6/2011 | Zhamu et al. |
| 2011/0176357 A1 | 7/2011 | Koyama et al. |
| 2011/0193520 A1 | 8/2011 | Yamazaki et al. |
| 2011/0199028 A1 | 8/2011 | Yamazaki et al. |
| 2011/0199825 A1 | 8/2011 | Han et al. |
| 2011/0205678 A1 | 8/2011 | Baba et al. |
| 2011/0229795 A1 | 9/2011 | Niu et al. |
| 2011/0267726 A1 | 11/2011 | Ikeuchi et al. |
| 2011/0291092 A1 | 12/2011 | Takemura |
| 2012/0062174 A1 | 3/2012 | Kamata |
| 2012/0170355 A1 | 7/2012 | Ohmaru et al. |
| 2012/0314524 A1 | 12/2012 | Takemura |
| 2013/0257354 A1 | 10/2013 | Koyama |
| 2013/0265010 A1 | 10/2013 | Nomura et al. |
| 2013/0306873 A1 | 11/2013 | Jun |
| 2014/0184165 A1* | 7/2014 | Takahashi ............ H01M 10/48 429/90 |
| 2015/0180248 A1* | 6/2015 | Yang ..................... H02J 7/0031 320/162 |
| 2016/0079746 A1 | 3/2016 | Ikeuchi et al. |
| 2017/0123008 A1* | 5/2017 | Frias ..................... H02H 9/005 |
| 2017/0244239 A1* | 8/2017 | Jin ........................ H02J 7/0029 |

FOREIGN PATENT DOCUMENTS

| | | |
|---|---|---|
| JP | 2010-066161 | 3/2010 |
| JP | 2013-230078 A | 11/2013 |
| JP | 2014-039459 A | 2/2014 |
| JP | 2014-143190 A | 8/2014 |
| JP | 2017-011802 A | 1/2017 |
| JP | 2018-142544 A | 9/2018 |
| TW | 201440285 | 10/2014 |
| WO | WO-2005/006822 | 1/2005 |
| WO | WO-2014/104266 | 7/2014 |

* cited by examiner

FIG. 16A1
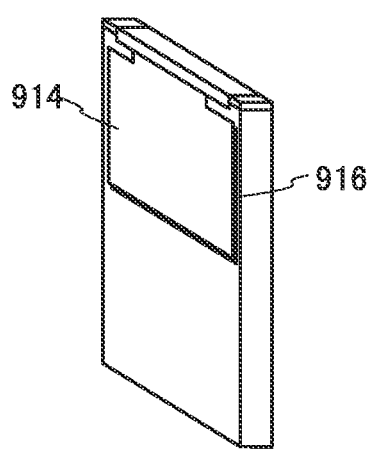
FIG. 16A2
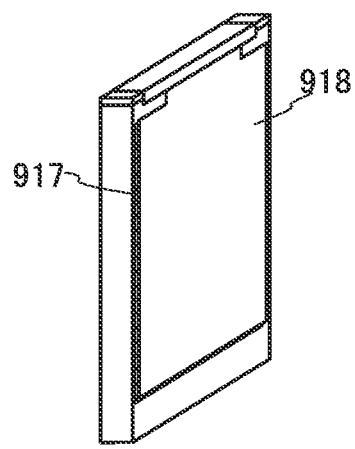
FIG. 16B1
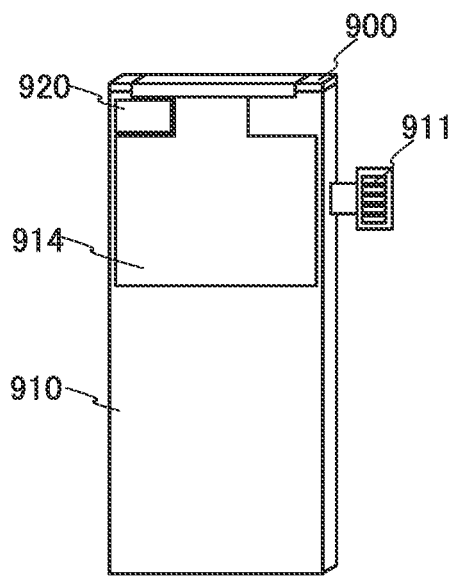
FIG. 16B2
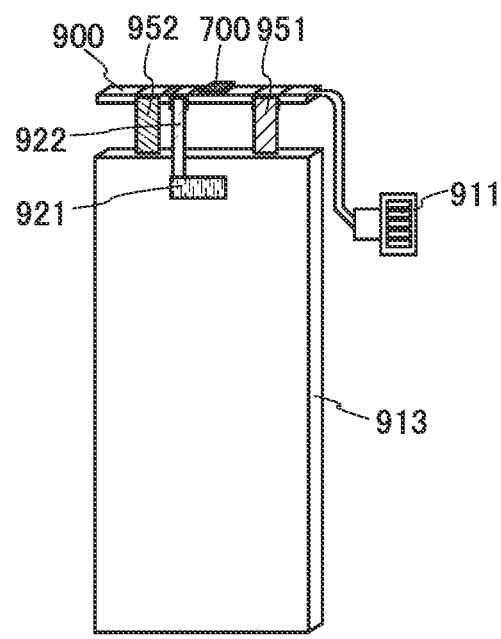
FIG. 16C
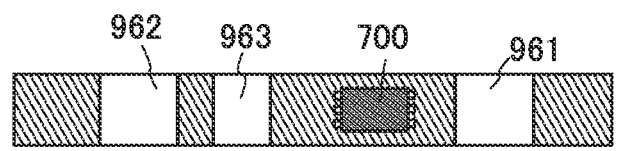

SECONDARY BATTERY PROTECTION CIRCUIT AND SECONDARY BATTERY ANOMALY DETECTION SYSTEM

TECHNICAL FIELD

One embodiment of the present invention relates to an object, a method, or a manufacturing method. Alternatively, the present invention relates to a process, a machine, manufacture, or a composition (composition of matter). One embodiment of the present invention relates to a manufacturing method of a semiconductor device, a display device, a light-emitting device, a power storage device, a lighting device, or an electronic device. One embodiment of the present invention relates to a vehicle or an electronic device for vehicles provided in a vehicle. In particular, one embodiment of the present invention relates to a secondary battery protection circuit, a secondary battery charge control method, a secondary battery anomaly detection system, and an electronic device including a secondary battery.

Note that in this specification, a power storage device refers to every element and device having a function of storing power. Examples of the power storage device include a secondary battery such as a lithium-ion secondary battery, a lithium-ion capacitor, an all-solid-state battery, and an electric double layer capacitor.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry, for portable information terminals such as mobile phones, smartphones, tablets, and notebook computers; portable music players; digital cameras; medical equipment; next-generation clean energy vehicles such as hybrid electric vehicles (HEV), electric vehicles (EV), and plug-in hybrid electric vehicles (PHEV); and the like. The lithium-ion secondary batteries are essential as rechargeable energy supply sources for today's information society.

In a portable information terminal, an electric vehicle, or the like, a plurality of secondary batteries connected in series or in parallel and provided with a protection circuit is used as a battery pack (also referred to as an assembled battery). Note that a battery pack means a container (e.g., a metal can or a film exterior body) in which a plurality of secondary batteries and a predetermined circuit are contained for easy handling of secondary batteries. The battery pack has an ECU (Electronic Control Unit) in order to manage the operation state.

If the plurality of secondary batteries constituting the battery pack (assembled battery) have different characteristics, the balance is disturbed. If the balance is disturbed, a secondary battery is excessively charged or not fully charged in a charging period; thus, the available capacity declines as a whole.

One battery pack, that is, a plurality of secondary batteries is collectively charged and discharged, which makes the balance more disturbed in one battery pack; life of a battery pack becomes shorter and shorter as charging and discharging are repeated. Thus, there has been a vicious spiral.

The secondary battery used in an electric vehicle or a hybrid electric vehicle degrades due to the number of charging, the depth of discharge, charging currents, charging environment (temperature change), or the like. The degradation also depends on the usage of the user; and charging temperatures, frequency of fast charging, charging amount from regenerative braking, charging timing with a regenerative brake, and the like might be related to the degradation.

Patent Document 1 discloses a battery state detection device that detects a minute short circuit of a secondary battery and a battery pack that incorporates it.

REFERENCE

Patent Document

[Patent Document 1] Japanese Published Patent Application No. 2010-66161

SUMMARY OF THE INVENTION

Problems to be Solved by the Invention

An object is to secure safety in such a manner that an anomaly of a secondary battery is detected with a protection circuit, for example, a phenomenon that lowers the safety of a secondary battery is detected early, and users are warned or the use of the secondary battery is stopped. Another object is to provide a protection circuit at low manufacturing costs.

Another object is to provide a protection circuit which detects an anomaly of a secondary battery in real time.

An object is to achieve a protection circuit which detects generation of a micro short circuit among anomalies of secondary batteries.

A micro-short circuit refers to a minute short circuit in a secondary battery, and is not a short circuit of a positive electrode and a negative electrode of a secondary battery which makes charging and discharging impossible but a phenomenon in which a small amount of short-circuit current flows through a minute short circuit portion for a short period. A micro short circuit is presumably caused in the following manner a plurality of charging and discharging operations generate deterioration, a metal element such as lithium or cobalt is precipitated in the battery, the growth of the precipitate generates the local concentration of current in part of a positive electrode and part of a negative electrode, and the function of a separator partially stops or a by-product is generated.

A thinner separator is desired for a smaller secondary battery, and furthermore, charging by high-speed power feeding at a high voltage is desired, both of which have a structure where a micro short circuit easily occurs in a secondary battery.

Conventionally, device designers set the upper limit voltage and the lower limit voltage of a secondary battery and limit the upper limit of the external output current. The range of the lower limit voltage to the upper limit voltage of the secondary battery is a recommended voltage range, and detection of anomalies which occur within that range, such as a micro short circuit, is not performed with a protection circuit or the like. Therefore, repeated flows of an instantaneous large current due to a micro short circuit may lead to anomalous heat generation and serious accidents, such as firing, of a secondary battery. For this reason, it is preferable to detect an anomaly or the like early. In addition, battery charge and discharge control for reducing this risk is also required.

Furthermore, as a phenomenon similar to the micro short circuit inside the battery, there exists a minute short circuit phenomenon due to electrochemical migration in the case where, in a battery pack containing a plurality of batteries, voltage detection lines for the respective internal batteries are gathered by a multi-pin connector. Detecting such a minute short circuit phenomenon is also an object.

Means for Solving the Problems

In order to detect a micro short circuit with high accuracy, part of an anomaly detection circuit for micro short circuits or the like is formed using a memory circuit (also referred to as a memory) which includes a transistor including an oxide semiconductor.

One embodiment of the present invention is a secondary battery protection circuit which includes a first memory circuit electrically connected to a secondary battery, a comparison circuit electrically connected to the first memory circuit, a second memory circuit electrically connected to the comparison circuit, and a power-off switch electrically connected to the second memory circuit. The power-off switch is electrically connected to the secondary battery, and the first memory circuit includes a first transistor including an oxide semiconductor and retains a voltage value of the secondary battery in an analog manner.

In the above-described structure, the second memory circuit includes a second transistor including an oxide semiconductor and retains data of the power-off switch.

In the above-described structure, the comparison circuit is electrically connected to the secondary battery, and when a voltage drop of the secondary battery occurs, an output signal of the comparison circuit is inverted, an anomaly is detected, and the power-off switch is brought into an off state.

In the above-described structure, the first memory circuit retains an offset voltage value of a secondary battery.

In the above-described structure, the first memory circuit is subjected to writing every period $\Delta t$ and the comparison circuit compares a voltage value of the secondary battery and a value retained in the first memory circuit.

Moreover, the protection circuit may include a circuit having a function of preventing overcharging or a circuit having a function of preventing overdischarging, in addition to the anomaly detection circuit for micro short circuits or the like.

Furthermore, a circuit having a function of displaying data on micro short circuits, such as the strength or the number of generation times of a micro short circuit, on the display screen may be included so as to urge the user to replace the secondary battery.

An anomaly detection system including a protection circuit is also one embodiment of the present invention, and is a secondary battery anomaly detection system which includes a data acquisition means of a voltage value of a secondary battery and a memory means which retains an offset voltage value of the secondary battery. Charging stops at a point in time when the voltage value of the secondary battery becomes largely different from the offset voltage value of the secondary battery.

An anomaly detection system including a protection circuit is also one embodiment of the present invention; and is a secondary battery anomaly detection system which has a structure including a data acquisition means of a voltage value of a secondary battery and a memory means which retains an offset voltage value of the secondary battery. A warning of an anomaly is given to a user at a point in time when the voltage value of the secondary battery becomes largely different from the offset voltage value of the secondary battery.

In the above-described anomaly detection system, the comparison is performed every period $\Delta t$ and the timing is not particularly limited as long as it is within the period for which the first memory circuit is capable of retention. Since the first memory circuit uses the transistor including an oxide semiconductor, the period $\Delta t$, which is the retention period, can be made longer than that of a memory which uses silicon. The period $\Delta t$ can be shortened as well, and real-time detection of a micro short circuit is possible.

Furthermore, in order to eliminate the period $\Delta t$ substantially, two or more anomaly detection circuits having different timings of micro short circuit detection may be used. Alternately using two or more anomaly detection circuits in sampling allows the detection interval to be short. Thus, real-time detection of a micro short circuit is possible.

The "real time" herein is not limited to the recent (latest) at that time and means a range from an instantaneous moment to 3 minutes at the maximum. For example, in the case where the interval between one sampling timing and the next sampling timing is one minute, it can be said that the micro short circuit detection is performed in real time.

Even when generation of a micro short circuit and sampling overlap at the time of detection by the first anomaly detection circuit, detection can be performed by the second anomaly detection circuit.

One structure disclosed in this specification is a secondary battery protection circuit which includes a first memory circuit electrically connected to a secondary battery, a first comparison circuit electrically connected to the first memory circuit, a second memory circuit electrically connected to the secondary battery, a second comparison circuit electrically connected to the second memory circuit, and an OR circuit to which an output of the first comparison circuit and an output of the second comparison circuit are each input. The first memory circuit includes at least a first transistor including an oxide semiconductor and retains a voltage value of the secondary battery in an analog manner, and the second memory circuit includes at least a second transistor including an oxide semiconductor and retains a voltage value of the secondary battery in an analog manner with a timing different from that of the first memory circuit.

Note that the OR circuit supplies, as the signal detection output, a signal representing logical OR.

Furthermore, a timing period for detecting a micro short circuit can be variable. A micro short circuit is a phenomenon that occurs during charging.

For example, in the case where the charging condition is the constant voltage charging condition, detection may be performed at intervals of 10 minutes by one anomaly detection circuit. Under the constant current charging condition, detection may be performed at intervals of 1 second with alternately used two anomaly detection circuits; thus, precise detection may be performed under the charging condition which might cause a micro short circuit.

Since the anomaly detection circuits are formed of memory circuits which include transistors including an oxide semiconductor, the anomaly detection circuit that is not in use consumes little electric power, which is useful.

When not charging, both of the two anomaly detection circuits may stop their operations; this is useful for low power consumption.

Furthermore, a third memory circuit electrically connected to the OR circuit having the above-described structure and a power-off switch electrically connected to the third memory circuit may be provided. Another structure disclosed in this specification is a secondary battery protection circuit which includes a first memory circuit electrically connected to a secondary battery; a first comparison circuit electrically connected to the first memory circuit; a second memory circuit electrically connected to the secondary battery; a second comparison circuit electrically connected to the second memory circuit; a third memory circuit electrically connected to the first comparison circuit and the second comparison circuit; and a power-off switch electrically connected to the third memory circuit.

An anomaly detection system including a protection circuit is also one embodiment of the present invention, and is a secondary battery anomaly detection system which includes a data acquisition means of a voltage value of a secondary battery and a memory means which retains an offset voltage value of the secondary battery. A charging condition is changed in accordance with the number of times or the strength of an anomaly point where the voltage value of the secondary battery becomes largely different from the offset voltage value of the secondary battery.

Effect of the Invention

An anomaly, in particular, a minute short circuit phenomenon such as a micro short circuit can be detected with a protection circuit. When an anomaly is detected, the output of the secondary battery is interrupted, so that accidents such as firing of a secondary battery can be prevented.

Furthermore, a transistor including an oxide semiconductor is used in an analog memory circuit (also referred to as an analog memory); thus, standby power consumption can reduced. Analog data of the voltage value of a secondary battery is input to a comparison circuit as it is without being amplified, which allows high-accuracy detection of micro short circuits.

Since two anomaly detection circuits are alternately used, a micro short circuit can be detected in real time.

BRIEF DESCRIPTION OF THE DRAWINGS

FIGS. 16 (A1), (A2), (B1), and (B2) are perspective views for explaining secondary batteries and (C) is a diagram showing a protection circuit board.

MODE FOR CARRYING OUT THE INVENTION

Embodiments of the present invention will be described in detail below with reference to the drawings. Note that the present invention is not limited to the following description, and it will be readily understood by those skilled in the art that modes and details of the present invention can be modified in various ways. In addition, the present invention should not be construed as being limited to the description of embodiments below.

Embodiment 1

Figure 1A:
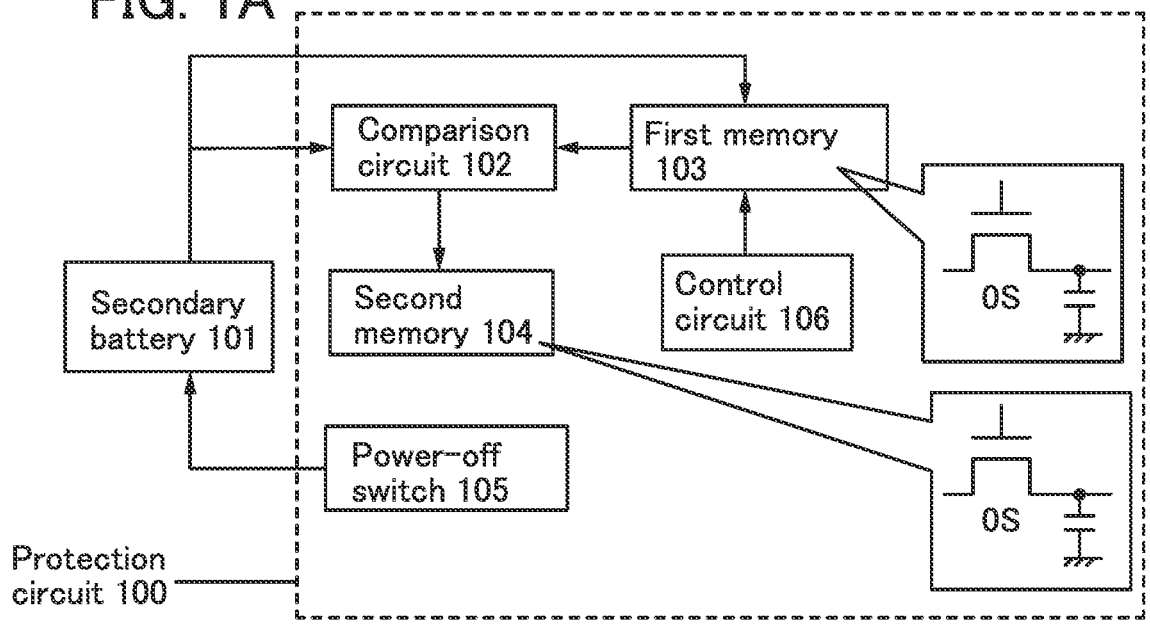
FIG. 1 (A) is an example of a block diagram showing one embodiment of the present invention, (B) is an example of a circuit configuration of a memory cell, and (C) is a diagram showing electrical characteristics of a transistor.

FIG. 1(A) shows an example of a block diagram of a protection circuit 100 which performs anomaly detection on a secondary battery 101.

As illustrated in FIG. 1(A), the protection circuit 100 for the secondary battery 101 includes at least a comparison circuit 102, a first memory 103, a second memory 104, a power-off switch 105, and a control circuit.

Although the secondary battery 101 and the protection circuit 100 are separately illustrated in FIG. 1(A), a terminal of the secondary battery 101 and a terminal of the protection circuit 100 mounted on a circuit board are each fixed by solder connection as a secondary battery module, in some cases.

A lithium-ion secondary battery is used as the secondary battery 101. In a lithium-ion secondary battery, deterioration is promoted if charging or discharging is performed excessively. Accordingly, in order to prevent overcharging and overdischarging, the condition at charging and discharging is controlled with a control circuit or the like so that the charging rate of a lithium-ion secondary battery can be within a certain range (for example, charging rate of 20% to 80% of the theoretical capacity, which is regarded as the maximum capacity here).

The comparison circuit 102 compares two input voltages in size and produces output. As the comparison circuit 102, a single-polarity circuit using a transistor that includes an oxide semiconductor in its channel formation region can also be used.

The first memory 103 is an analog memory and stores an offset analog potential of a secondary battery. The data of the offset voltage value of the secondary battery is created by application of a write signal to a gate of a transistor of the first memory 103 with the use of parasitic capacitance between the gate electrode and a drain electrode. The first memory 103 is formed of one transistor including an oxide semiconductor in its channel formation region and a capacitor. The first memory 103 can also be referred to as a high-accuracy charging voltage monitor circuit. Furthermore, the first memory 103 can take advantage of the low leakage current of the transistor including an oxide semiconductor in its channel formation region.

The second memory 104 has an element structure similar to that of the first memory 103 and is formed of one transistor including an oxide semiconductor in its channel formation region and a capacitor. The second memory 104 retains data of the power-off switch 105. The second memory is used for temporary storage. Even being output in a short time, it is not noise, and by saving it in a memory including an oxide semiconductor, the power switch is surely switched.

The power-off switch 105 is a switch for blocking supply of electric power to a power source of a secondary battery where an anomaly has been generated. With circuit configuration illustrated in FIG. 1(A) of the power-off switch 105, the secondary battery 101 where an anomaly has been generated can be prevented from being charged continuously and firing of the battery can be avoided.

Figure 2:
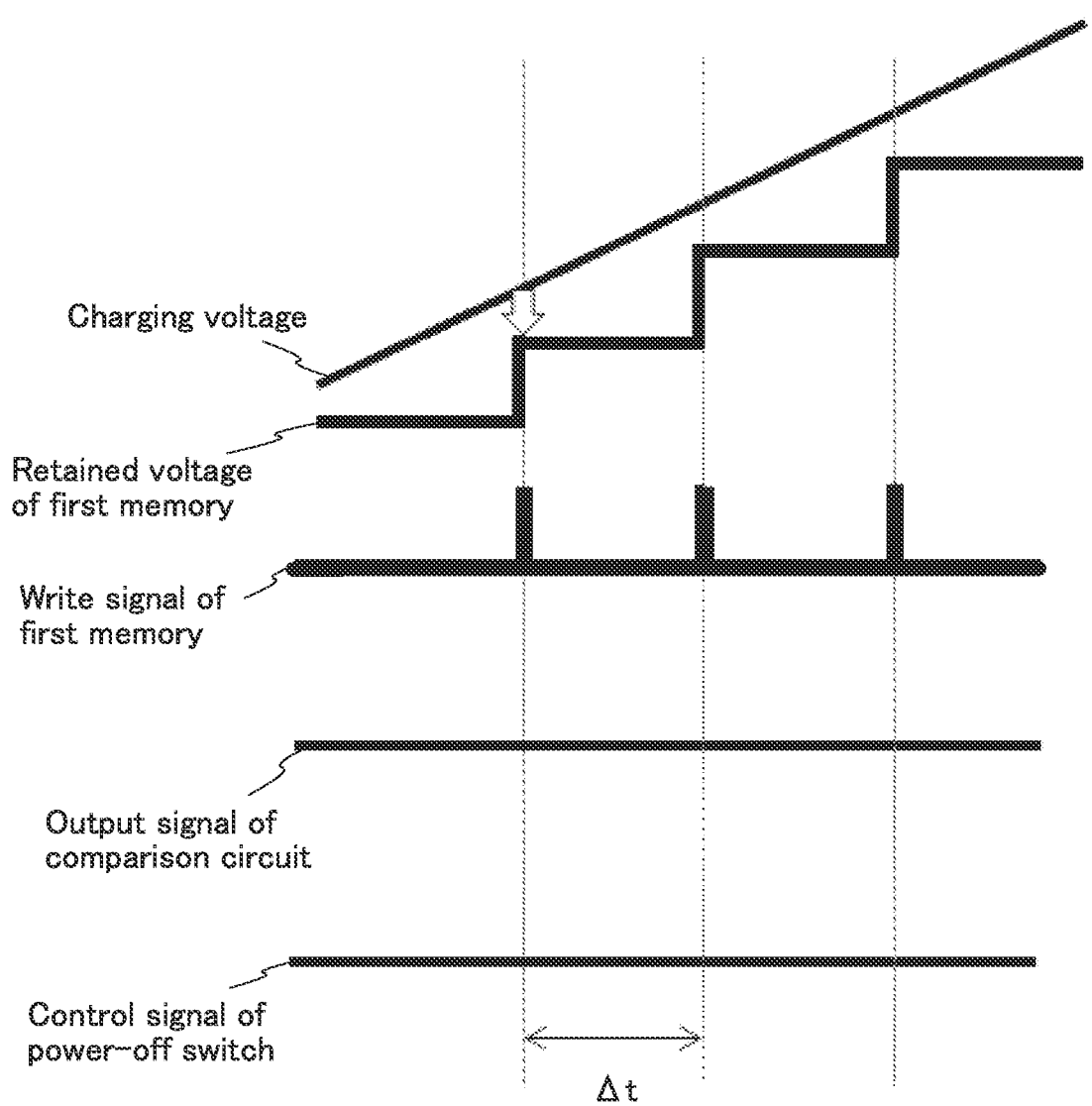
FIG. 2 A timing chart in normal operation showing one embodiment of the present invention.

FIG. 2 shows an example of a timing chart in normal operation. Note that FIG. 2 shows a period in the charge operation of a secondary battery. In FIG. 2, Δt represents a sampling period. In FIG. 2, sampling is performed three times, and every sampling operation is performed normally. The charging voltage of the secondary battery, the retained voltage of the first memory, the write signal for the memory, the output signal of the comparison circuit, the control signal of the power-off switch are each shown in FIG. 2.

In normal operation, the offset charging voltage of the secondary battery which is obtained by setting the write signal to High is stored in the first memory. In normal operation, the result of the comparison between the retained voltage of the first memory and the charging voltage of the secondary battery is always High and the control signal of the power-off switch is also High.

Figure 3:
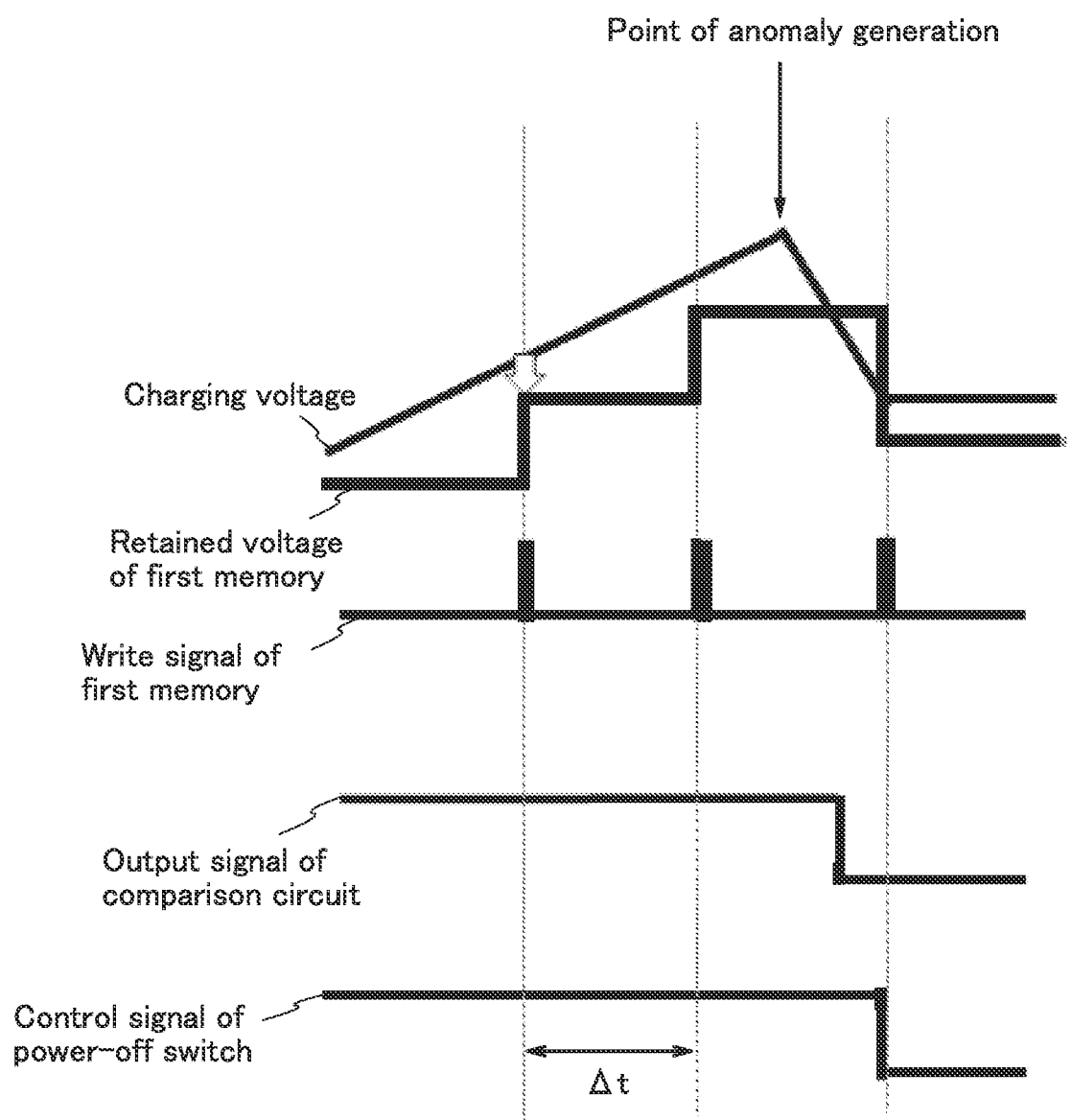
FIG. 3 A timing chart in normal operation showing one embodiment of the present invention.

FIG. 3 shows an example of a timing chart of the time when an anomaly is generated.

Figure 7:
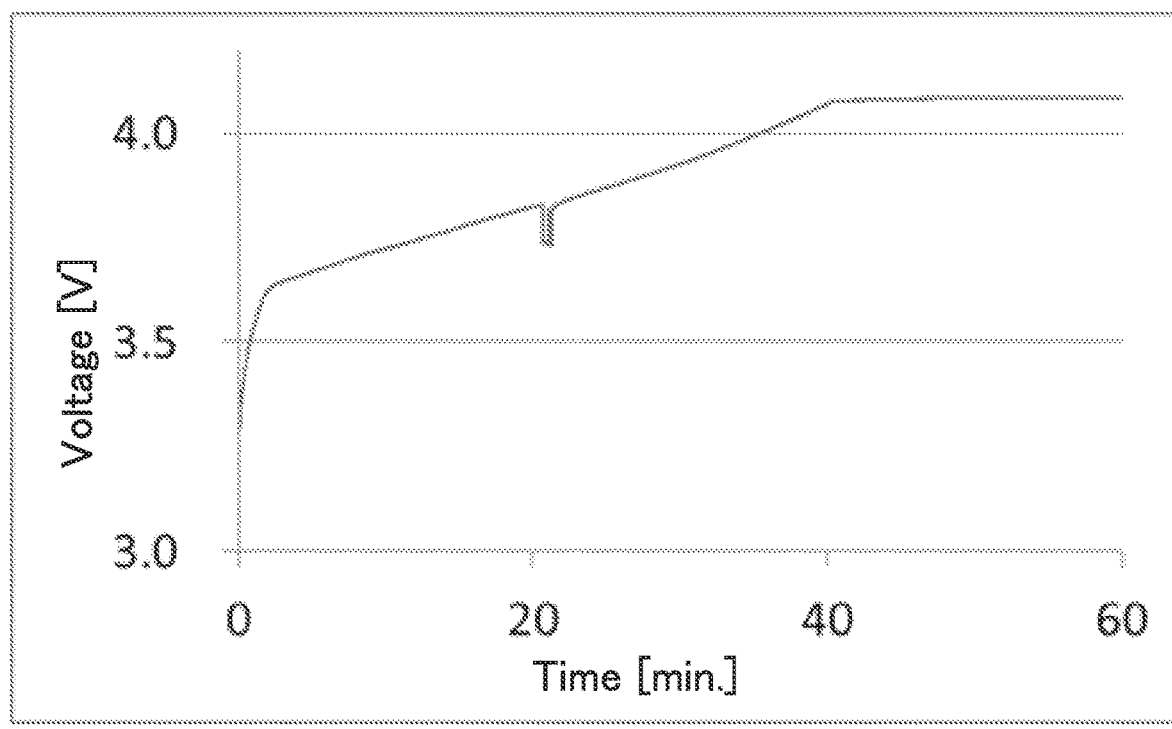
FIG. 7 A graph for explaining a micro short circuit.

When an anomaly such as a micro short circuit is generated, the charging voltage of the secondary battery drops suddenly, and anomaly current flows inside the battery through a path where the protection circuit does not exist (inside the battery). FIG. 7 shows a graph showing micro short circuit generation at approximately 20 minutes during charging, where the vertical axis represents voltage and the horizontal axis represents time, for example. In FIG. 3, the point at which the charging voltage suddenly falls is the point of anomaly generation. In FIG. 3, sampling is performed three times; the first and second samplings are performed normally, and the third sampling is performed with an anomaly. At the third sampling (writing of the memory), the output signal of the comparison circuit is inverted and an anomaly behavior is detected; as a result, the control signal of the power-off switch became Low, and the power-off switch is brought into an off state, whereby the supply of electric power to the secondary battery can be stopped.

Although FIG. 1(A) shows an example in which the supply of electric power to the secondary battery is stopped with the power-off switch 105 after anomaly detection, the charging condition may be changed, charging may be stopped for a while, or a warning may be displayed in accordance with the number of times an anomaly has been detected, for example.

Figure 4:
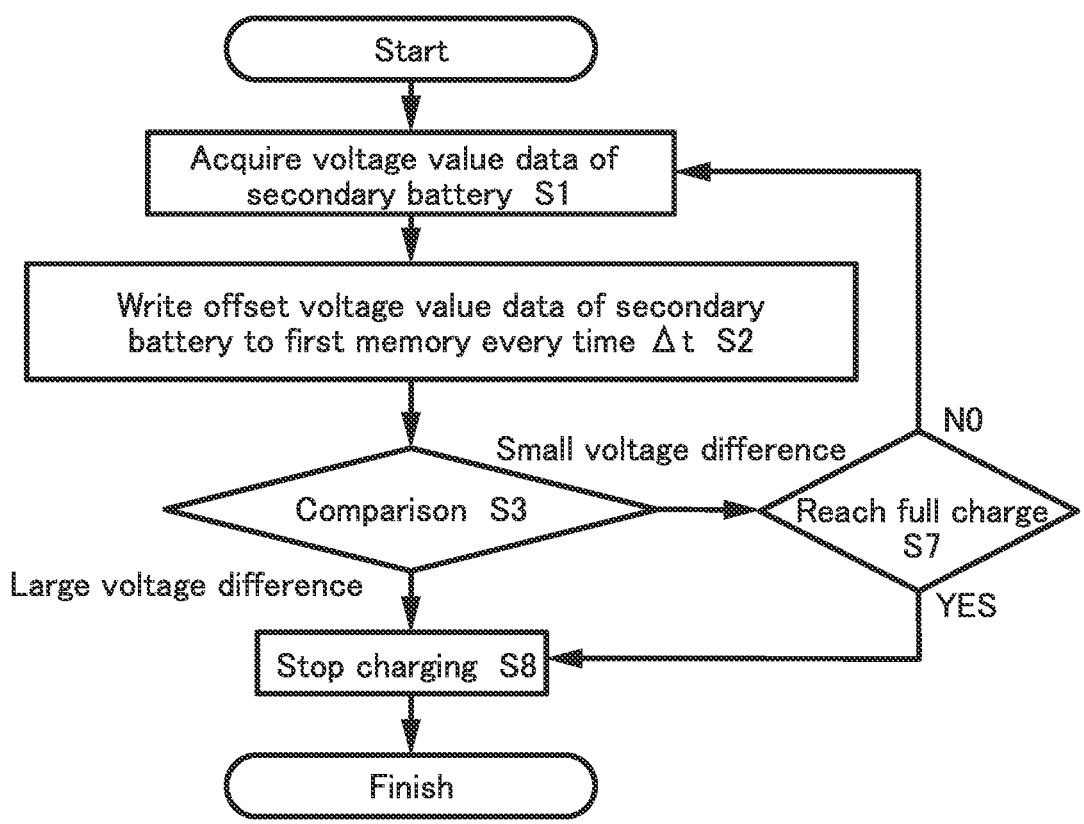
FIG. 4 An example of a flow chart showing one embodiment of the present invention.

FIG. 4 shows an example of a flow for the case where anomaly detection is performed on a mobile device equipped with a secondary battery a plurality of times in one charging operation.

First, voltage value data of a secondary battery is acquired with a voltage value acquisition means such as a voltage monitor (S1). Then, the offset voltage data of the secondary battery is written to the first memory circuit every sampling period Δt (S2).

Next, voltage values measured at the present time and a different time are compared (comparison step: S3). In the case where the comparison result indicates that the difference between the two input voltages is small, the above-described data acquisition and comparison repeat. When charging continues without any detection of an anomaly and reaches full charge (S7), charging stops (S8).

In the case where the difference between the two input voltages is large in the comparison step S3, it is judged that an anomaly has been generated, and charging of the secondary battery stops (S8).

The structure of detecting an anomaly such as a micro short circuit has been chiefly described here; however, without a particular limitation, prevention of overdischarging, prevention of overcharging, and control of the amount of charging current in accordance with the cell balance in an assembled battery, the temperature, and the degradation degree may be conducted in the same charging period, for example.

Figure 1B:
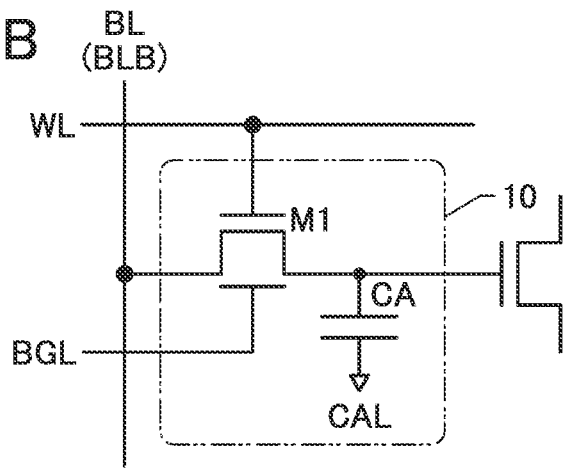

A memory cell that can be used in the first memory 103 and the second memory 104 in FIG. 1(A) is shown in FIG. 1(B). FIG. 1(B) shows a circuit configuration example of the memory cell with a transistor including a back gate.

A memory cell 10 includes a transistor M1 and a capacitor CA. Note that the transistor M1 includes a front gate (also simply referred to as a "gate") and a back gate. The back gate is placed so that a channel formation region of a semiconductor layer is sandwiched between the gate and the back gate. Note that the gate and the back gate are named for convenience; when one is referred to as a "gate", the other is referred to as a "back gate". Thus, the names "gate" and "back gate" can be interchanged with each other. One of a gate and a back gate is referred to as a "first gate" and the other is referred to as a "second gate", in some cases.

One of a source and a drain of the transistor M is electrically connected to one electrode of the capacitor CA. The other of the source and the drain of the transistor M1 is electrically connected to one of a bit line BL and a bit line BLB. The gate of the transistor M1 is electrically connected to a word line WL, and the back gate of the transistor M1 is electrically connected to a wiring BGL. The other electrode of the capacitor CA is connected to a wiring CAL.

The wiring CAL functions as a wiring for applying a predetermined potential to the other electrode of the capacitor CA. At the time of data writing and data reading, a fixed potential such as VSS is preferably supplied to the wiring CAL.

The wiring BGL functions as a wiring for applying a potential to the back gate of the transistor M1.

Figure 1C:
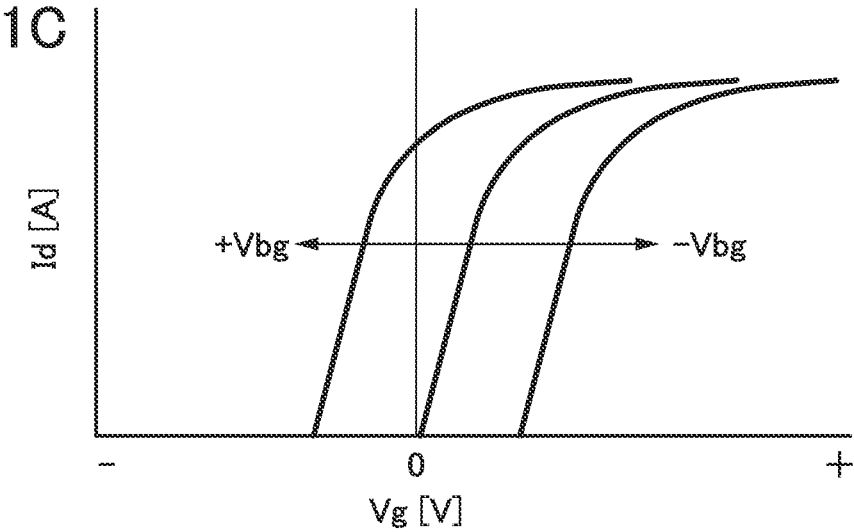

FIG. 1(C) shows an example of Id-Vg characteristics, one of electrical characteristics of a transistor. The Id-Vg characteristics show a change in drain current (Id) with respect to a change in gate voltage (Vg). The horizontal axis in FIG. 1(C) represents Vg on a linear scale. The vertical axis in FIG. 1(C) represents Id on a log scale. As shown in FIG. 1(C), when a positive bias voltage +Vbg is supplied to the wiring BGL as a back gate voltage (Vbg), Id-Vg characteristics shift in the negative Vg direction. When a negative bias voltage −Vbg is supplied to the wiring BGL, Id-Vg characteristics shift in the positive Vg direction. The shift amount of the Id-Vg characteristics depends on the voltage supplied to the wiring BGL. By the application of an appropriate voltage to the wiring BGL, the threshold voltage of the transistor M1 can be increased or decreased.

Data writing and reading are performed in such a manner that a potential that brings the transistor M1 into a conduction state (an on state) is supplied to the word line WL to bring the transistor M1 into a conduction state and the bit line BL or the bit line BLB and the one electrode of the capacitor CA are electrically connected to each other.

As the transistor M1, a transistor including an oxide semiconductor, which is a kind of a metal oxide, in a semiconductor layer where a channel is formed (also referred to as an "OS transistor") is preferably used. For the semiconductor layer where a channel is formed, an oxide semiconductor including any one of indium, an element M (the element M is aluminum, gallium, yttrium, or tin), and zinc is preferably used, for example. In particular, an oxide semiconductor formed of indium, gallium, and zinc is preferably used for the semiconductor layer of the OS transistor.

The OS transistor using an oxide semiconductor including indium, gallium, and zinc has a feature of an extremely low off-state current. The use of an OS transistor as the transistor M1 enables the leakage current of the transistor M1 to be extremely low. That is, written data can be retained for a long time with the transistor M1; thus, the frequency of refresh of the memory cell can be reduced. In addition, refresh operation for the memory cell can be omitted. Owing to an extremely low leakage current, the memory cell can retain analog data.

Embodiment 2

Figure 5:
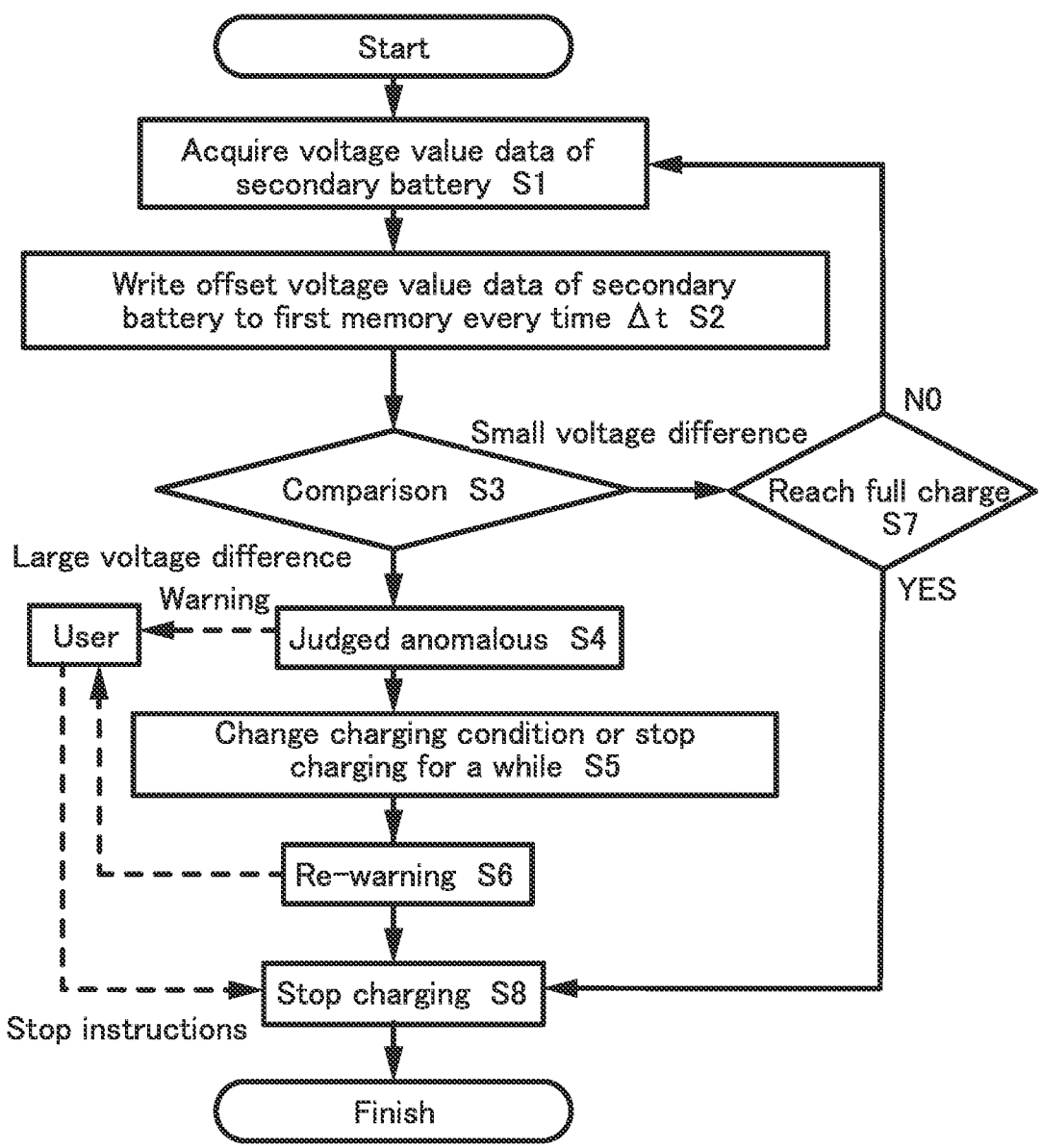
FIG. 5 An example of a flow chart showing one embodiment of the present invention.

In this embodiment, an example of flow which is different from that in Embodiment 1 is described. FIG. 5 shows an example of a flow for the case where anomaly detection is performed on a mobile device equipped with a secondary battery a plurality of times in one charging operation.

First, voltage value data of a secondary battery is acquired with a voltage value acquisition means such as a voltage monitor (S1). Then, the offset voltage data of the secondary battery is written to the first memory circuit every sampling period Δt (S2).

Voltage values measured at the present time and a different time are compared (comparison step: S3). In the case where the comparison result indicates that the difference between the two input voltages is small, the above-described data acquisition and comparison repeat. When charging continues without any detection of an anomaly and reaches full charge (S7), charging stops (S8).

In the case where the difference between the two input voltages is large, it is judged that an anomaly has been generated (S4). When it is judged anomalous (S4), the strength is preferably determined; the anomaly level may be classified into "strong", "medium", "weak", for example. In the case where the anomaly's strength is strong and charging needs to stop immediately, a warning is given to a user on a display screen or through a speaker of a mobile device, and if the user gives instructions to stop charging, charging of the secondary battery stops (S8).

If the anomaly's strength is weak at the anomaly judgement (S4), the charging condition may be changed or charging may be stopped for a while (S5) in accordance with the number of times a micro short circuit has occurred or the strength of a micro short circuit. If the micro short circuit is at a weak level, the secondary battery can be continuously used. The change of the charging condition is, for example, switching between fast charging and normal charging (reduction in charging current), reduction in maximum charging voltage, and switching between constant voltage charging and constant current charging. The reduction in charging current or the reduction in maximum charging voltage may be performed step by step in accordance with the number of times an anomaly has been generated.

In the case where it is repeatedly judged that an anomaly of a weak micro short circuit has been generated, a re-warning is given to the user (S6), and charging is stopped (S8) so that safety can be secured by the frequency even though it is the weak micro short circuit. The re-warning is given to the user on the basis of the charging history of the secondary battery.

The structure of detecting an anomaly such as a micro short circuit has been chiefly described here; however, without a particular limitation, prevention of overdischarging, prevention of overcharging, and control of the amount of charging current in accordance with the cell balance in an assembled battery, the temperature, and the degradation degree may be conducted in the same charging period, for example. For example, in the case where the temperature is lower than the room temperature (approximately 25° C.), the amount of current in charging is set smaller than that of normal. Furthermore, in the case where the degradation degree is high, the amount of current in charging is set smaller than normal. Furthermore, at high temperatures of 40° C. or more, the maximum charging voltage and the amount of current are limited. In addition, the cell balance is adjusted so that the voltage does not exceed the working voltage at the time of charging in an assembled battery. These controls can further increase the safety of the secondary battery.

This embodiment can be freely combined with any of the other embodiments.

Embodiment 3

In this embodiment, an example of using a plurality of transistors in the first memory 103 is described.

Figure 6A:
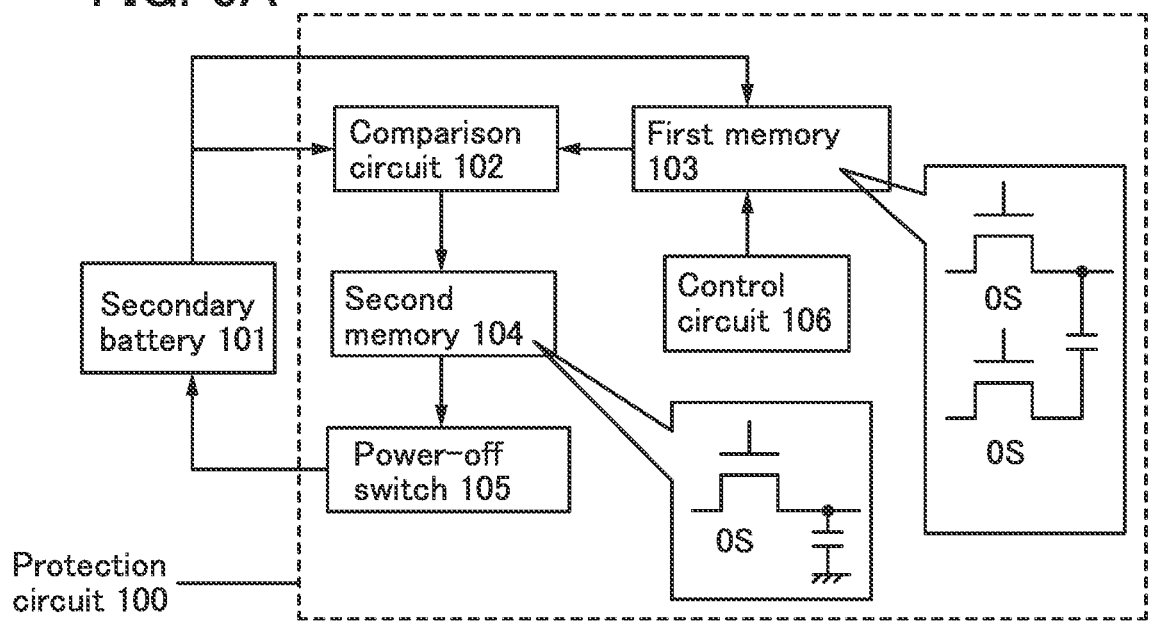
FIGS. 6 (A) and (B) are examples of block diagrams showing embodiments of the present invention.

In this embodiment, data of the offset voltage value of a secondary battery is created by using two transistors in the first memory 103 as shown in FIG. 6(A). With the use of two transistors, the offset value can be adjusted. The offset refers to a voltage that is slightly output even though the input signal is 0 V.

Note that in FIG. 6(A), the same portions as those in FIG. 1(A) are denoted by the same reference numerals.

Figure 6B:
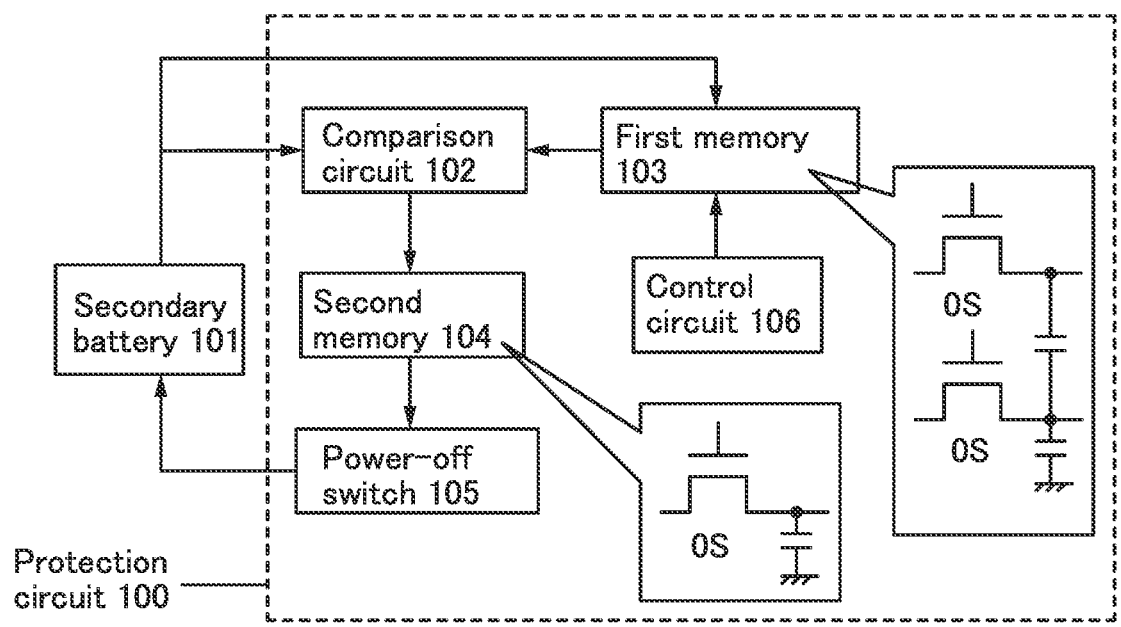

Moreover, one capacitor may be added to form the first memory 103 shown in FIG. 6(B). The data of the offset voltage value of the secondary battery can be created by capacitive coupling with the capacitor.

Note that in FIG. 6(B), the same portions as those in FIG. 1(A) are denoted by the same reference numerals.

With the structure of the first memory 103 shown in FIG. 6(A) or FIG. 6(B), the offset amount can be adjusted and the voltage difference of the secondary battery which is judged anomalous can be adjusted.

This embodiment can be freely combined with any of the other embodiments.

Embodiment 4

In this embodiment, structure examples of a transistor that can be used in the memory cell of the protection circuit described in the above embodiment will be described.

Transistor Structure Example 1

A structure example of a semiconductor device in which a capacitor and a plurality of transistors are formed over one semiconductor substrate is described below.

Figure 8:
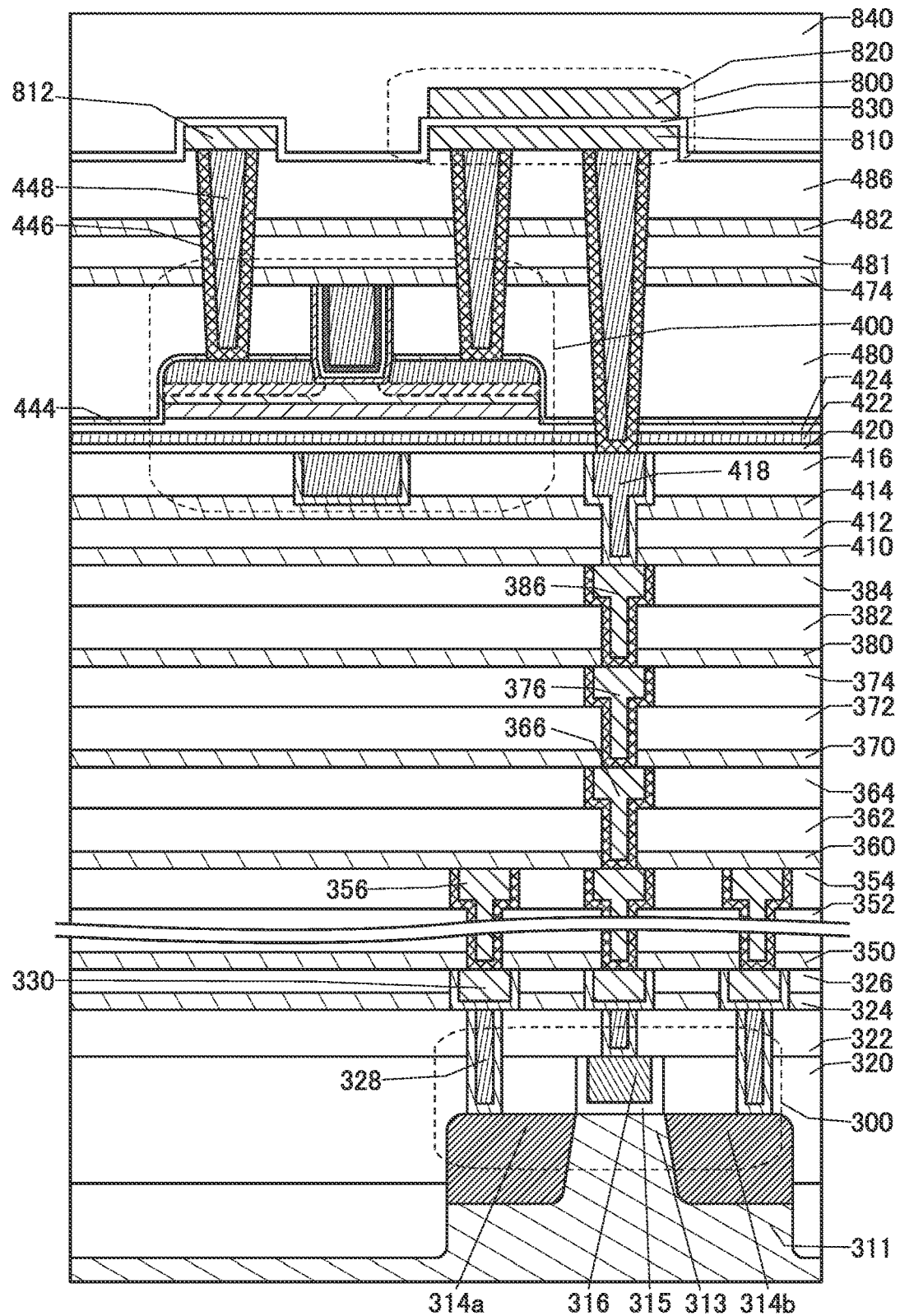
FIG. 8 A cross-sectional view showing a structure example of a semiconductor device.

A semiconductor device illustrated in FIG. 8 includes a transistor 300, a transistor 400, and a capacitor 800.

The transistor 400 is a transistor including a metal oxide in its channel formation region (an OS transistor). Since the off-state current of the transistor 400 is low, the use of the transistor 400 as an OS transistor included in a semiconductor device enables long-term retention of written data.

The semiconductor device described in this embodiment includes the transistor 300, the transistor 400, and the capacitor 800 as illustrated in FIG. 8. The transistor 400 is provided above the transistor 300, and the capacitor 800 is provided above the transistor 300 and the transistor 400.

The transistor 300 is provided on a substrate 311 and includes a conductor 316, an insulator 315, a semiconductor region 313 that is a part of the substrate 311, and a low-resistance region 314a and a low-resistance region 314b functioning as a source region and a drain region.

In the transistor 300, the top surface and the side surface in the channel width direction of the semiconductor region 313 are covered with the conductor 316 with the insulator 315 therebetween. Such a FIN-type transistor 300 can have an increased effective channel width, and thus have improved on-state characteristics. In addition, contribution of electric fields of the gate electrode can be increased, so that the off-state characteristics of the transistor 300 can be improved.

Note that the transistor 300 can be a p-channel transistor or an n-channel transistor.

A region of the semiconductor region 313 where a channel is formed, a region in the vicinity thereof, the low-resistance region 314a and the low-resistance region 314b functioning as the source region and the drain region, and the like preferably contain a semiconductor such as a silicon-based semiconductor, further preferably contain single crystal silicon. Alternatively, the regions may be formed using a material containing Ge (germanium), SiGe (silicon germanium), GaAs (gallium arsenide), GaAlAs (gallium aluminum arsenide), or the like. Silicon whose effective mass is adjusted by applying stress to the crystal lattice and thereby changing the lattice spacing may be used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or a conductive material such as a metal material, an alloy material, or a metal oxide material.

Note that the work function depends on a material used for a conductor; therefore, selecting the material for the conductor can adjust the threshold voltage of the transistor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 9:
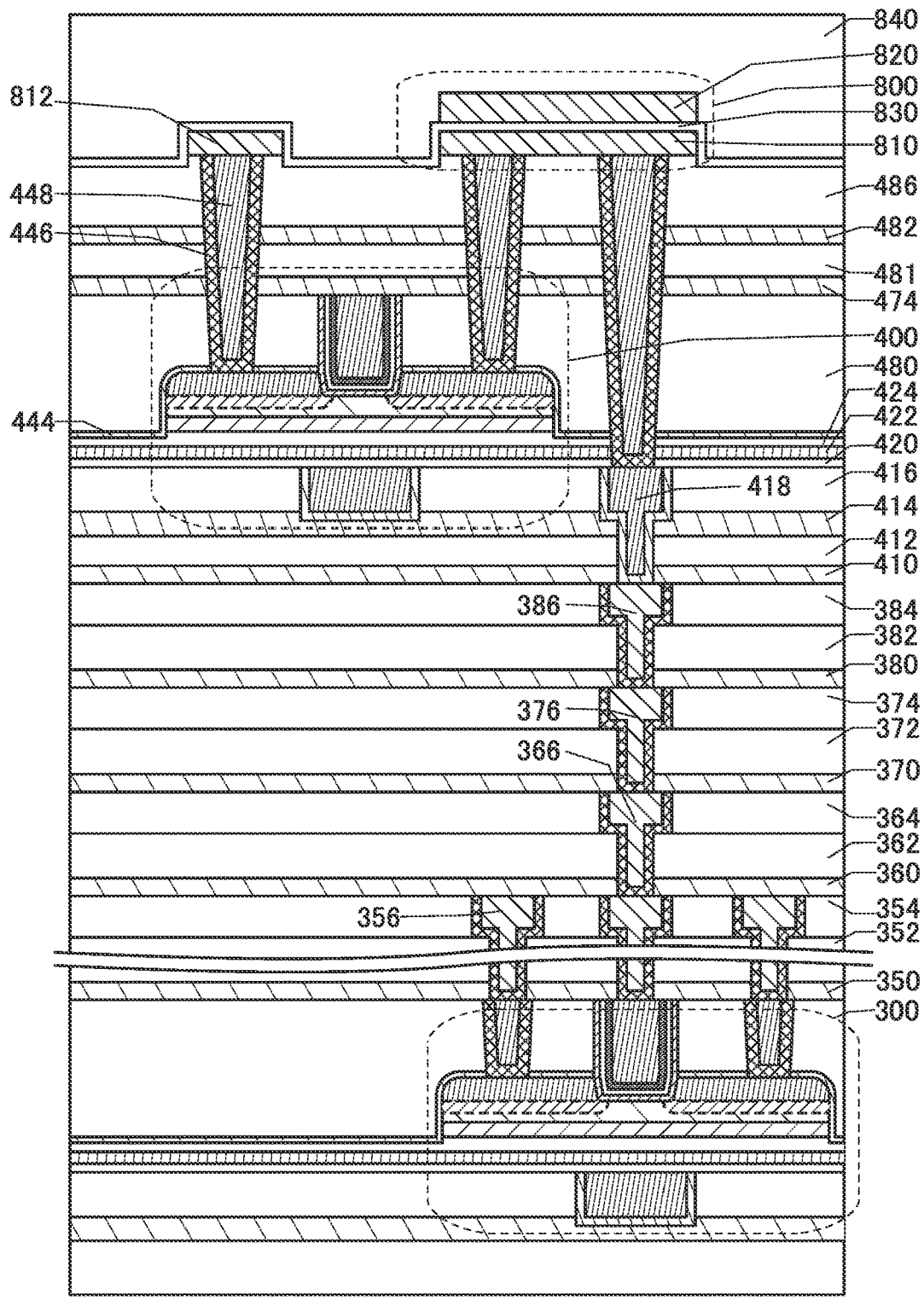
FIG. 9 A cross-sectional view showing a structure example of a semiconductor device.

Note that the transistor 300 illustrated in FIG. 8 is just an example and is not limited to having the structure shown therein; an appropriate transistor can be used in accordance with the circuit configuration or the driving method. For example, when a semiconductor device is formed using only OS transistors, the transistor 300 employs a structure similar to that of the transistor 400 using an oxide semiconductor, as illustrated in FIG. 9.

An insulator 320, an insulator 322, an insulator 324, and an insulator 326 are stacked in this order to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 300 or the like provided under the insulator 322. For example, the top surface of the insulator 322 may be planarized by planarization treatment using a chemical mechanical polishing (CMP) method or the like to improve planarity.

The insulator 324 is preferably formed using a film having a barrier property that prevents hydrogen or impurities from the substrate 311, the transistor 300, or the like from diffusing to a region where the transistor 400 is provided.

For the film having a barrier property against hydrogen, silicon nitride formed by a CVD method can be used, for example. The diffusion of hydrogen to a semiconductor element including an oxide semiconductor, such as the transistor 400, may result in degradation of the characteristics of the semiconductor element. Therefore, a film that inhibits hydrogen diffusion is preferably used between the transistor 400 and the transistor 300. The film that inhibits hydrogen diffusion is specifically a film from which a small amount of hydrogen is released.

A conductor 328, a conductor 330, and the like that are connected to the capacitor 800 or the transistor 400 are embedded in the insulator 320, the insulator 322, the insulator 324, and the insulator 326. Note that the conductor 328 and the conductor 330 have a function of a plug or a wiring.

A plurality of conductors having a function of a plug or a wiring are collectively denoted by the same reference numeral in some cases.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 8, an insulator 350, an insulator 352, and an insulator 354 are stacked in this order. Furthermore, a conductor 356 is formed in the insulator 350, the insulator 352, and the insulator 354. The conductor 356 has a function of a plug or a wiring that is connected to the transistor 300. Note that the conductor 356 can be formed using a material similar to those for the conductor 328 and the conductor 330.

For example, the insulator 350 is preferably formed using an insulator having a barrier property against hydrogen, like the insulator 324. Note that as the conductor having a barrier property against hydrogen, tantalum nitride can be used, for example.

A wiring layer may be provided over the insulator 354 and the conductor 356. For example, in FIG. 8, an insulator 360, an insulator 362, and an insulator 364 are stacked in this order. Moreover, a conductor 366 is formed in the insulator 360, the insulator 362, and the insulator 364. The conductor 366 has a function of a plug or a wiring. Note that the conductor 366 can be formed using a material similar to those for the conductor 328 and the conductor 330.

For example, the insulator 360 is preferably formed using an insulator having a barrier property against hydrogen, like the insulator 324. Furthermore, the conductor 366 preferably contains a conductor having a barrier property against hydrogen. In particular, the conductor having a barrier property against hydrogen is formed in an opening of the insulator 360 having a barrier property against hydrogen. With this structure, the transistor 300 and the transistor 400 can be separated by the barrier layer, so that the diffusion of hydrogen from the transistor 300 to the transistor 400 can be inhibited.

A wiring layer may be provided over the insulator 364 and the conductor 366. For example, in FIG. 8, an insulator 370, an insulator 372, and an insulator 374 are stacked in this order. Furthermore, a conductor 376 is formed in the insulator 370, the insulator 372, and the insulator 374. The conductor 376 has a function of a plug or a wiring. Note that the conductor 376 can be formed using a material similar to those for the conductor 328 and the conductor 330.

For example, the insulator 370 is preferably formed using an insulator having a barrier property against hydrogen, like the insulator 324. Furthermore, the conductor 376 preferably contains a conductor having a barrier property against hydrogen. In particular, the conductor having a barrier property against hydrogen is formed in an opening of the insulator 370 having a barrier property against hydrogen. With this structure, the transistor 300 and the transistor 400 can be separated by the barrier layer, so that the diffusion of hydrogen from the transistor 300 to the transistor 400 can be inhibited.

A wiring layer may be provided over the insulator 374 and the conductor 376. For example, in FIG. 8, an insulator 380, an insulator 382, and an insulator 384 are stacked in this order. Moreover, a conductor 386 is formed in the insulator 380, the insulator 382, and the insulator 384. The conductor 386 has a function of a plug or a wiring. Note that the conductor 386 can be formed using a material similar to those for the conductor 328 and the conductor 330.

For example, the insulator 380 is preferably formed using an insulator having a barrier property against hydrogen, like the insulator 324. Furthermore, the conductor 386 preferably contains a conductor having a barrier property against hydrogen. In particular, the conductor having a barrier property against hydrogen is formed in an opening of the insulator 380 having a barrier property against hydrogen. With this structure, the transistor 300 and the transistor 400 can be separated by the barrier layer, so that the diffusion of hydrogen from the transistor 300 to the transistor 400 can be inhibited.

An insulator 410, an insulator 412, an insulator 414, and an insulator 416 are stacked in this order over the insulator 384. A material with a barrier property against oxygen or hydrogen is preferably used for any of the insulator 410, the insulator 412, the insulator 414, and the insulator 416.

For example, the insulator 410 and the insulator 414 are preferably formed using a film having a barrier property that prevents hydrogen or impurities from the substrate 311, a region where the transistor 300 is provided, or the like from diffusing to the region where the transistor 400 is provided. Therefore, a material similar to that for the insulator 324 can be used.

Figure 24:
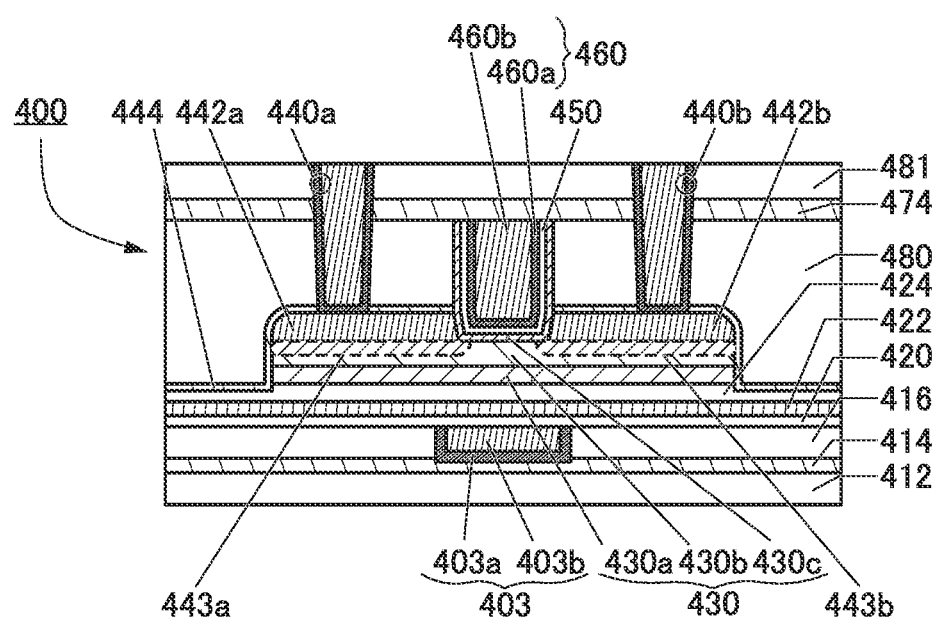
FIG. 24 An example of a cross-sectional view of a transistor 400 used for showing one embodiment of the present invention.

For the film having a barrier property against hydrogen used for the insulator 410 and the insulator 414, a metal oxide such as aluminum oxide, hafnium oxide, or tantalum oxide is preferably used, for example. FIG. 24 illustrate the transistor 400.

The insulator 412 and the insulator 416 can be formed using a material similar to that for the insulator 320, for example.

A conductor 418, a conductor 403 included in the transistor 400, and the like are embedded in the insulator 410, the insulator 412, the insulator 414, and the insulator 416. Note that the conductor 418 has a function of a plug or a wiring that is connected to the capacitor 800 or the transistor 300.

In particular, a region of the conductor 403a that is in contact with the insulator 410 and the insulator 414 is preferably a conductor having a barrier property against oxygen, hydrogen, and water. With this structure, the transistor 300 and the transistor 400 can be separated by the layer having a barrier property against oxygen, hydrogen, and water; hence, the diffusion of hydrogen from the transistor 300 to the transistor 400 can be inhibited.

The transistor 400 is provided over the insulator 416.

As illustrated in FIG. 24, the transistor 400 includes the conductor 403 positioned to be embedded in the insulator 414 and the insulator 416, an insulator 420 positioned over the insulator 416 and the conductor 403, an insulator 422 positioned over the insulator 420, an insulator 424 positioned over the insulator 422, an oxide 430a positioned over the insulator 424, an oxide 430b positioned over the oxide 430a, a conductor 442a and a conductor 442b positioned apart from each other over the oxide 430b, an insulator 480 that is positioned over the conductor 442a and the conductor 442b and has an opening between the conductor 442a and the conductor 442b, an oxide 430c positioned on a bottom surface and a side surface of the opening, an insulator 450 positioned on the formation surface of the oxide 430c, and a conductor 460 positioned on the formation surface of the insulator 450.

Furthermore, an insulator 444 is preferably provided between the insulator 480 and the oxide 430a, the oxide 430b, the conductor 442a, and the conductor 442b.

Furthermore, the conductor 460 preferably includes a conductor 460a provided on the inner side of the insulator 450 and a conductor 460b provided to be embedded on the inner side of the conductor 460a. Moreover, an insulator 474 is preferably provided over the insulator 480, the conductor 460, and the insulator 450.

Hereinafter, the oxide 430a, the oxide 430b, and the oxide 430c may be collectively referred to as an oxide 430.

The transistor 400 has a structure where the three layers of the oxide 430a, the oxide 430b, and the oxide 430c are stacked in the region where the channel is formed and its vicinity; however, the present invention is not limited to this. For example, the transistor may have a single-layer structure of the oxide 430b, a two-layer structure of the oxide 430b and the oxide 430a, a two-layer structure of the oxide 430b and the oxide 430c, or a stacked-layer structure of four or more layers. Although the conductor 460 is shown to have a two-layer structure in the transistor 400, the present invention is not limited to this. For example, the conductor 460 may have a single-layer structure or a stacked-layer structure of three or more layers. The transistor 400 illustrated in FIG. 8 and FIG. 24 is just an example and is not limited to the structure shown therein; an appropriate transistor can be used in accordance with a circuit configuration or a driving method.

Here, the conductor 460 functions as a gate electrode of the transistor, and the conductor 442a and the conductor 442b function as a source electrode and a drain electrode. As described above, the conductor 460 is embedded in an opening of the insulator 480 and the region between the conductor 442a and the conductor 442b. The positions of the conductor 460, the conductor 442a, and the conductor 442b are selected in a self-aligned manner with respect to the opening in the insulator 480. That is, in the transistor 400, the gate electrode can be positioned between the source electrode and the drain electrode in a self-aligned manner. Thus, the conductor 460 can be formed without an alignment margin, resulting in a reduction in the area occupied by the transistor 400. Accordingly, miniaturization and high integration of the semiconductor device can be achieved.

Since the conductor 460 is formed in the region between the conductor 442a and the conductor 442b in a self-aligned manner, the conductor 460 has neither a region overlapping with the conductor 442a nor a region overlapping with the conductor 442b. Thus, parasitic capacitance formed between the conductor 460 and the conductors 442a and 442b can be reduced. As a result, the transistor 400 can have increased switching speed and increased frequency characteristics.

The conductor 460 functions as a first gate (also referred to as top gate) electrode in some cases. The conductor 403 functions as a second gate (also referred to as bottom gate) electrode in some cases. In that case, the threshold voltage of the transistor 400 can be controlled by changing a potential applied to the conductor 403 independently of a potential applied to the conductor 460. In particular, when a negative potential is applied to the conductor 403, the threshold voltage of the transistor 400 can be higher than 0 V, and the off-state current can be reduced. Thus, a drain current at the time when a potential applied to the conductor 460 is 0 V can be smaller in the case where a negative potential is applied to the conductor 403 than in the case where a negative potential is not applied to the conductor 403.

The conductor 403 is positioned to overlap with the oxide 430 and the conductor 460. Thus, when potentials are applied to the conductor 460 and the conductor 403, an electric field generated from the conductor 460 and an electric field generated from the conductor 403 are connected and can cover the channel formation region formed in the oxide 430. In this specification and the like, a transistor structure in which a channel formation region is electrically surrounded by electric fields of a first gate electrode and a second gate electrode is referred to as a surrounded channel (S-channel) structure.

The conductor 403 has a structure similar to that of the conductor 418; a conductor 403a is formed in contact with an inner wall of the opening in the insulator 414 and the insulator 416, and a conductor 403b is formed further inside. Although the transistor 400 in which the conductor 403a and the conductor 403b are stacked is illustrated, the present invention is not limited thereto. For example, the conductor 403 may have a single-layer structure or a stacked-layer structure of three or more layers.

The conductor 403a is preferably formed using a conductive material having a function of inhibiting diffusion of impurities such as a hydrogen atom, a hydrogen molecule, a water molecule, and a copper atom (a conductive material through which the above impurities do not easily pass). Alternatively, the conductor 403a is preferably formed using a conductive material having a function of inhibiting diffusion of oxygen (e.g., at least one of oxygen atoms, oxygen molecules, and the like) (a conductive material through which the above oxygen does not easily pass). Note that in this specification, a function of inhibiting diffusion of impurities or oxygen means a function of inhibiting diffusion of any one or all of the above impurities and the above oxygen.

For example, when the conductor 403a has a function of inhibiting diffusion of oxygen, a reduction in conductivity of the conductor 403b due to oxidation can be inhibited.

When the conductor 403 also functions as a wiring, the conductor 403b is preferably formed using a conductive material that has high conductivity and contains tungsten, copper, or aluminum as its main component. In that case, a conductor 405 does not always need to be provided. Note that the conductor 403b is a single layer in the diagram but may have a stacked-layer structure, for example, a stacked-layer structure of titanium or titanium nitride and any of the above conductive materials.

The insulator 420, the insulator 422, the insulator 424, and the insulator 450 have a function of a second gate insulating film.

Here, as the insulator 424 in contact with the oxide 430, an insulator containing more oxygen than that in the stoichiometric composition is preferably used. That is, an excess-oxygen region is preferably formed in the insulator 424. When such an insulator containing excess oxygen is provided in contact with the oxide 430, oxygen vacancies in the oxide 430 can be reduced, and the reliability of the transistor 400 can be improved.

When the insulator 424 includes an excess-oxygen region, the insulator 422 preferably has a function of inhibiting diffusion of oxygen (e.g., oxygen atoms and oxygen molecules) (that is, it is preferable that the insulator 422 do not easily transmit the above oxygen).

The insulator 422 preferably has a function of inhibiting diffusion of oxygen or impurities, in which case diffusion of oxygen contained in the oxide 430 to the insulator 420 side is prevented. Furthermore, the conductor 403 can be prevented from reacting with oxygen in the insulator 424 or the oxide 430.

The insulator 422 is preferably a single layer or stacked layers using an insulator containing a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST).

It is particularly preferable to use an insulator containing an oxide of one or both of aluminum and hafnium, which is an insulating material having a function of inhibiting diffusion of impurities, oxygen, and the like (i.e., an insulating material through which the above oxygen does not easily pass). As the insulator containing an oxide of one or both of aluminum and hafnium, aluminum oxide, hafnium oxide, an oxide containing aluminum and hafnium (hafnium aluminate), or the like is preferably used. In the case where the insulator 422 is formed using such a material, the insulator 422 functions as a layer that inhibits release of oxygen from the oxide 430 and entry of impurities such as hydrogen from the periphery of the transistor 400 into the oxide 430.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

It is preferable that the insulator 520 be thermally stable. For example, silicon oxide and silicon oxynitride, which have thermal stability, are suitable. Furthermore, combination of an insulator which is a high-k material and silicon oxide or silicon oxide oxynitride enables the insulator 420 and the insulator 426 to have a stacked-layer structure that has thermal stability and a high dielectric constant.

Note that in the transistor 400, the insulator 520, the insulator 422, and the insulator 424 are shown as the second gate insulating film having a stacked-layer structure of three layers; however, the second gate insulating film may have a single-layer structure, a two-layer structure, or a stacked-layer structure of four or more layers. In such cases, without limitation to a stacked-layer structure formed of the same material, a stacked-layer structure formed of different materials may be employed.

The metal oxide functioning as the channel formation region in the oxide 430 has a band gap of preferably 2 eV or higher, further preferably 2.5 eV or higher. The use of a metal oxide having a wide band gap can reduce the off-state current of the transistor.

By including the oxide 430a under the oxide 430b, the oxide 430 can inhibit diffusion of impurities into the oxide 430b from the components formed below the oxide 430a. By including the oxide 430c over the oxide 430b, the oxide 430 can inhibit diffusion of impurities into the oxide 430b from the components formed above the oxide 430c.

The oxide 430 preferably has a stacked-layer structure of oxides that differ in the atomic ratio of metal atoms. Specifically, the atomic proportion of the element M to the constituent elements in the metal oxide used as the oxide 430a is preferably greater than that in the metal oxide used as the oxide 430b. The atomic ratio of the element M to In in the metal oxide used as the oxide 430a is preferably greater than that in the metal oxide used as the oxide 430b. The atomic ratio of In to the element M in the metal oxide used as the oxide 430b is preferably greater than that in the metal oxide used as the oxide 430a. The oxide 430c can be formed using a metal oxide that can be used as the oxide 430a or the oxide 430b.

The conductor 442a and the conductor 442b functioning as the source electrode and the drain electrode are provided over the oxide 430b.

A region 443a and a region 443b are sometimes formed as low-resistance regions in the oxide 430 at and around the interface with the conductor 442a (the conductor 442b). In this case, the region 443a functions as one of a source region and a drain region, and the region 443b functions as the other of the source region and the drain region. The channel formation region is formed in a region between the region 443a and the region 443b.

The insulator 444 is provided to cover the conductor 442a and the conductor 442b and inhibits oxidation of the conductor 442a and the conductor 442b. Here, the insulator 444 may be provided to cover the side surface of the oxide 430 and to be in contact with the insulator 424.

A metal oxide containing one or more selected from hafnium, aluminum, gallium, yttrium, zirconium, tungsten, titanium, tantalum, nickel, germanium, neodymium, lanthanum, magnesium, and the like can be used as the insulator 444. Moreover, silicon nitride oxide, silicon nitride, or the like can be used as the insulator 444.

It is particularly preferable to use an insulator containing an oxide of one or both of aluminum and hafnium, such as aluminum oxide, hafnium oxide, or an oxide containing aluminum and hafnium (hafnium aluminate), as the insulator 444.

The insulator 444 can inhibit impurities such as water and hydrogen contained in the insulator 480 from diffusing into the oxide 430b through the oxide 430c and the insulator 450. The insulator 444 can also inhibit oxidation of the conductor 460 due to excess oxygen contained in the insulator 480.

When an insulator from which oxygen is released by heating is provided as the insulator 450 in contact with the top surface of the oxide 430c, oxygen can be effectively supplied from the insulator 450 to the channel formation region of the oxide 430b through the oxide 430c. Furthermore, as in the insulator 424, the concentration of impurities such as water or hydrogen in the insulator 450 is preferably lowered. The thickness of the insulator 450 is preferably greater than or equal to 1 nm and less than or equal to 20 nm.

The conductor 460 functioning as the first gate electrode may have a single-layer structure or a stacked-layer structure of two or more layers.

The conductor 460a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom.

The conductor 460b is preferably formed using a conductive material containing tungsten, copper, or aluminum as its main component.

The insulator 480 is provided over the conductor 442a and the conductor 442b with the insulator 444 positioned therebetween. The insulator 480 preferably includes an excess-oxygen region.

The opening in the insulator 480 overlaps with the region between the conductor 442a and the conductor 442b. Accordingly, the conductor 460 is formed to be embedded in the opening of the insulator 480 and the region between the conductor 442a and the conductor 442b.

The insulator 474 is preferably provided in contact with the top surface of the insulator 480, the top surface of the conductor 460, and the top surface of the insulator 450. When the insulator 474 is formed by a sputtering method, an excess-oxygen region can be provided in the insulator 450 and the insulator 480. Thus, oxygen can be supplied from the excess-oxygen region to the oxide 430.

An insulator 481 functioning as an interlayer film is preferably provided over the insulator 474. As in the insulator 424 and the like, the concentration of impurities such as water or hydrogen in the insulator 481 is preferably lowered.

A conductor 440a and a conductor 440b are provided in openings formed in the insulator 481, the insulator 474, the insulator 480, and the insulator 444. The conductor 440a and the conductor 440b are provided to face each other with the conductor 460 positioned therebetween. The conductor 540a and the conductor 440b each have a structure similar to that of a conductor 446 and a conductor 448 that will be described later.

An insulator 482 is provided over the insulator 481. A substance having a barrier property against oxygen and hydrogen is preferably used for the insulator 482.

An insulator 486 is provided over the insulator 482. The insulator 486 can be formed using a material similar to that for the insulator 320.

The conductor 446, the conductor 448, and the like are embedded in the insulator 420, the insulator 422, the insulator 424, the insulator 444, the insulator 480, the insulator 474, the insulator 481, the insulator 482, and the insulator 486.

The conductor 446 and the conductor 448 function as plugs or wirings that are connected to the capacitor 800, the transistor 400, or the transistor 300. The conductor 446 and the conductor 448 can be formed using a material similar to those for the conductor 328 and the conductor 330.

The capacitor 800 is provided above the transistor 400. The capacitor 800 includes a conductor 810, a conductor 820, and an insulator 830.

A conductor 812 may be provided over the conductor 446 and the conductor 448. The conductor 812 has a function of a plug or a wiring that is connected to the transistor 400. The conductor 810 has a function of an electrode of the capacitor 800. The conductor 812 and the conductor 810 can be formed at the same time.

The conductor 820 is provided so as to overlap with the conductor 810 with the insulator 830 positioned therebetween. The conductor 820 can be formed using a conductive material such as a metal material, an alloy material, or a metal oxide material.

An insulator 840 is provided over the conductor 820 and the insulator 830. The insulator 840 can be provided using a material similar to that for the insulator 320. The insulator 840 may function as a planarization film that covers an uneven shape thereunder.

With the use of this structure, a change in electrical characteristics can be reduced and the reliability can be improved in a semiconductor device including a transistor including an oxide semiconductor. Alternatively, a battery protection circuit using a transistor including an oxide semiconductor can be miniaturized or highly integrated.

Transistor Structure Example 2

Figure 10A:
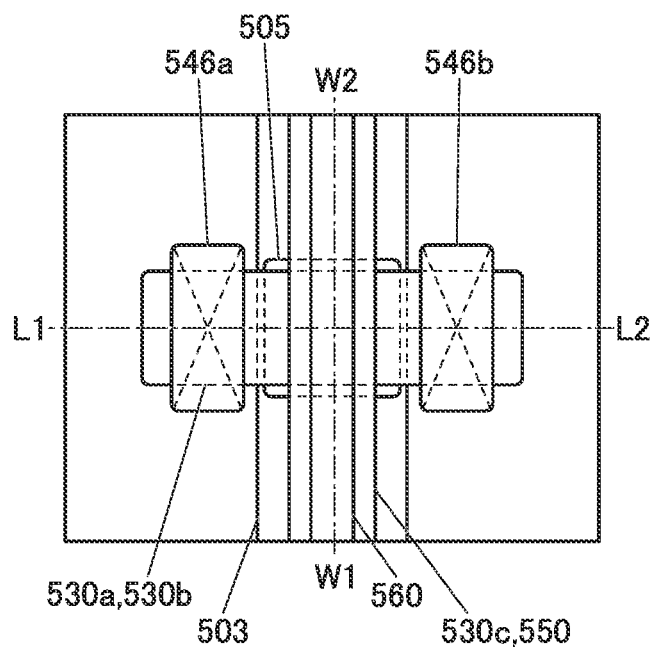
FIG. 10 (A) is a top view of a transistor, and (B) and (C) are cross-sectional views for explaining a structure example of the transistor.
Figure 10C:
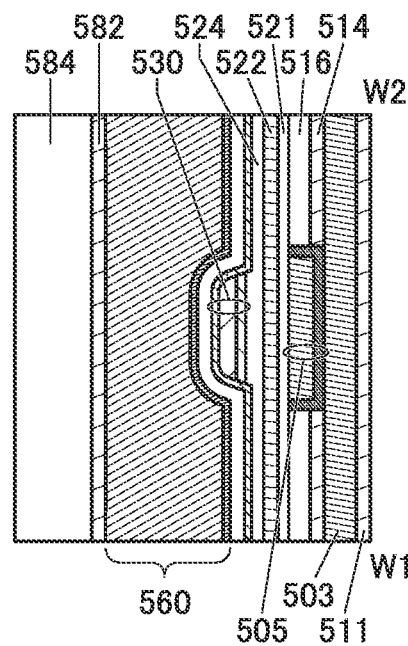
Figure 10B:
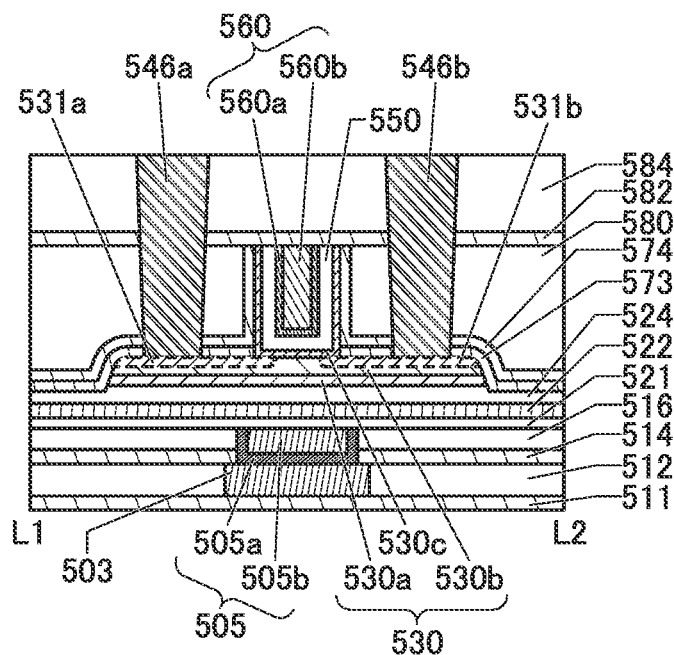

A structure example of a transistor 510B will be described with reference to FIGS. 10(A), 10(B), and 10(C). FIG. 10(A) is a top view of the transistor 510B. FIG. 10(B) is a cross-sectional view of a portion along the dashed-dotted line L1-L2 in FIG. 10(A). FIG. 10(C) is a cross-sectional view of a portion along the dashed-dotted line W1-W2 in FIG. 10(A). Note that for simplification of the drawing, some components are not illustrated in the top view in FIG. 10(A).

The transistor 510B is a variation example of the transistor described in the above structural example 1. Therefore, differences from the above transistor are mainly described to avoid repeated description.

In FIGS. 10(A) to 10(C), a conductive layer 542 (a conductive layer 542a and a conductive layer 542b) is not provided, and part of an exposed surface of an oxide 530b includes a region 531a and a region 531b. One of the region 531a and the region 531b functions as a source region, and the other functions as a drain region. Moreover, an insulating layer 573 is included between the oxide 530b and the insulating layer 574.

A region 531 (the region 531a and the region 531b) illustrated in FIG. 10 is a region where the above element is added to the oxide 530b. The regions 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the regions 531 are formed. For the addition of the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Hydrogen, carbon, nitrogen, fluorine, sulfur, chlorine, titanium, a rare gas, or the like can also be used. Typical examples of a rare gas include helium, neon, argon, krypton, and xenon. The concentration of the element can be measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulating layer 573 and an insulating film to be the insulating layer 574 may be deposited over the oxide 530b and the dummy gate. Stacking the insulating film to be the insulating layer 573 and the insulating layer 574 can provide a region where the region 531, the oxide 530c, and the insulating layer 550 overlap with each other.

Specifically, after an insulating film to be the insulating layer 580 is provided over the insulating film to be the insulating layer 574, the insulating film to be the insulating layer 580 is subjected to CMP (Chemical Mechanical Polishing) treatment, whereby part of the insulating film to be the insulating layer 580 is removed and the dummy gate is exposed. Then, when the dummy gate is removed, part of the insulating layer 573 in contact with the dummy gate is preferably also removed. Thus, the insulating layer 574 and the insulating layer 573 are exposed at the side surface of the opening provided in the insulating layer 580, and the region 531 provided in the oxide 530b is partly exposed at the bottom surface of the opening. Next, an oxide film to be the oxide 530c, an insulating film to be the insulating layer 550, and a conductive film to be the conductive layer 560 are formed in this order in the opening, and then, the oxide film to be the oxide 530c, the insulating film to be the insulating layer 550, and the conductive film to be the conductive layer 560 are partly removed by CMP treatment or the like until the insulating layer 580 is exposed; thus, the transistor illustrated in FIG. 10 can be formed.

Note that the insulating layer 573 and the insulating layer 574 are not essential components. Design is appropriately determined in consideration of required transistor characteristics.

The cost of the transistor illustrated in FIG. 10 can be reduced because an existing apparatus can be used.

Transistor Structure Example 3

Figure 11A:
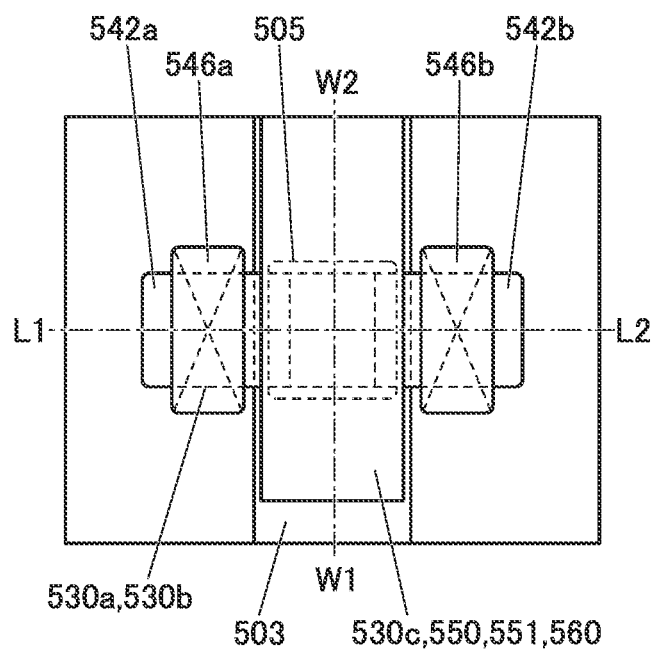
FIG. 11 (A) is a top view of a transistor, and (B) and (C) are cross-sectional views for explaining a structure example of the transistor.
Figure 11C:
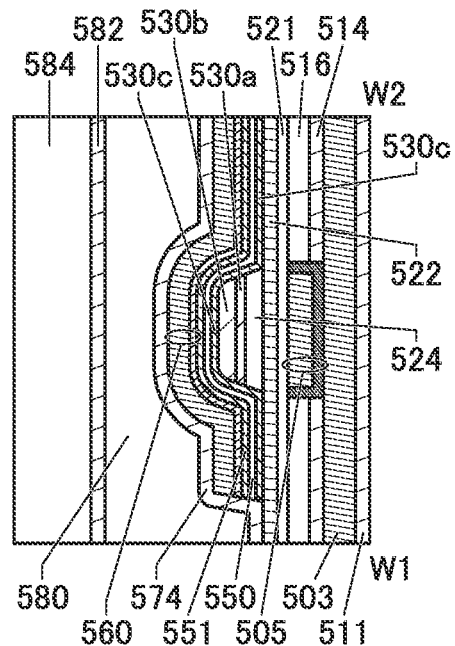
Figure 11B:
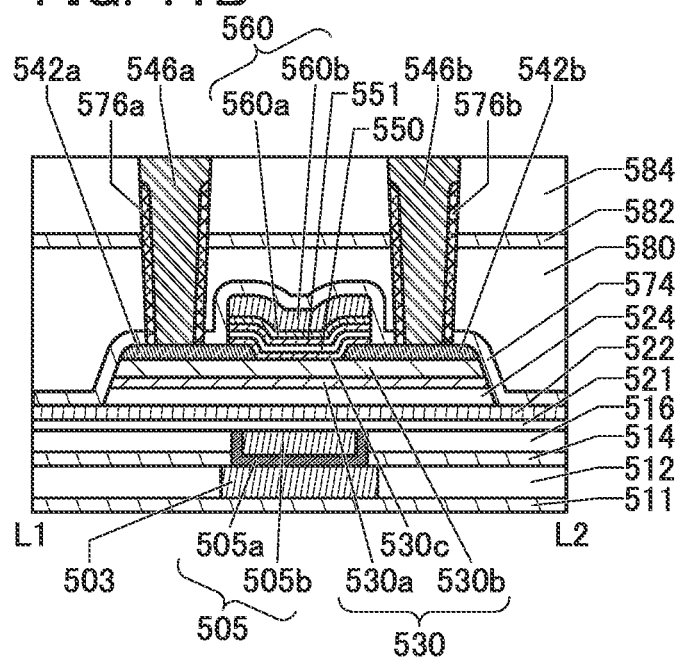

A structure example of a transistor 510C will be described with reference to FIGS. 11(A), 11(B), and 11(C). FIG. 11(A) is a top view of the transistor 510C. FIG. 11(B) is a cross-sectional view of a portion along the dashed-dotted line L1-L2 in FIG. 11(A). FIG. 11(C) is a cross-sectional view of a portion along the dashed-dotted line W1-W2 in FIG. 11(A). Note that for simplification of the drawing, some components are not illustrated in the top view in FIG. 11(A).

The transistor 510C is a variation example of the transistor 400. Therefore, differences from the transistor 400 are mainly described to avoid repeated description.

The transistor 510C includes a region where the conductive layer 542 (the conductive layer 542a and the conductive layer 542b), the oxide 530c, the insulating layer 550, an oxide 551, and the conductive layer 560 overlap with each other. With this structure, a transistor having a high on-state current can be provided. Moreover, a transistor having high controllability can be provided.

The conductive layer 560 functioning as a first gate electrode includes the conductive layer 560a and the conductive layer 560b over the conductive layer 560a. Like a conductor 505a, the conductive layer 560a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of oxygen atoms, oxygen molecules, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity.

In addition, to adjust Vth of the transistor, a material used for the conductive layer 560a may be determined in consideration of a work function. For example, the conductive layer 560a may be formed using titanium nitride, and the conductive layer 560b may be formed using tungsten. The conductive layer 560a and the conductive layer 560b are formed by a known deposition method such as a sputtering method, a CVD method, or an AFM method. Note that the deposition temperature in the case where titanium nitride is deposited by a CVD method is preferably higher than or equal to 380° C. and lower than or equal to 500° C., further preferably higher than or equal to 400° C. and lower than or equal to 450° C.

The oxide 551 may be formed using a material similar to those of the other insulating layers. As the oxide 551, a metal oxide such as an In—M—Zn oxide containing excess oxygen (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) may be used. For example, as the oxide 551, an In—Ga—Zn oxide is deposited by a sputtering method. Specifically, for example, deposition is performed using a target with an atomic ratio of In:Ga:Zn=1:3:4 and a sputtering gas containing oxygen. In the case where the oxide 551 is deposited by a sputtering method, the flow rate ratio of oxygen contained in the sputtering gas is preferably higher than or equal to 70%, further preferably higher than or equal to 80%, still further preferably 100%.

When a gas containing oxygen is used as a sputtering gas, oxygen can be supplied not only to the oxide 551 but also to the insulating layer 550 that is a formation surface of the oxide 551. Furthermore, when the flow rate ratio of oxygen contained in the sputtering gas is increased, the amount of oxygen supplied to the insulating layer 550 can be increased.

Moreover, when the oxide 551 is provided over the insulating layer 550, excess oxygen contained in the insulating layer 550 is unlikely to be diffused into the conductive layer 560. Thus, the reliability of the transistor can be increased. Note that the oxide 551 may be omitted depending on purposes or the like.

The insulating layer 574 is preferably provided to cover the top surface and the side surface of the conductive layer 560, the side surface of the insulating layer 550, and the side surface of the oxide 530c. For the insulating layer 574, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide; silicon nitride oxide; silicon nitride; or the like.

The insulating layer 574 can inhibit oxidation of the conductive layer 560. Moreover, the insulating layer 574 can inhibit diffusion of impurities such as water and hydrogen contained in the insulating layer 580 into the transistor 510C.

The insulating layer 576 (the insulating layer 576a and the insulating layer 576b) having a barrier property may be provided between the conductive layer 546 and the insulating layer 580. Providing the insulating layer 576 can prevent oxygen in the insulating layer 580 from reacting with the conductive layer 546 and oxidizing the conductive layer 546.

Furthermore, with the insulating layer 576 having a barrier property, the range of choices for the material of the conductor used as the plug or the wiring can be expanded. A metal material having an oxygen absorbing property and high conductivity can be used for the conductive layer 546, for example.

Transistor Structure Example 4

Figure 12A:
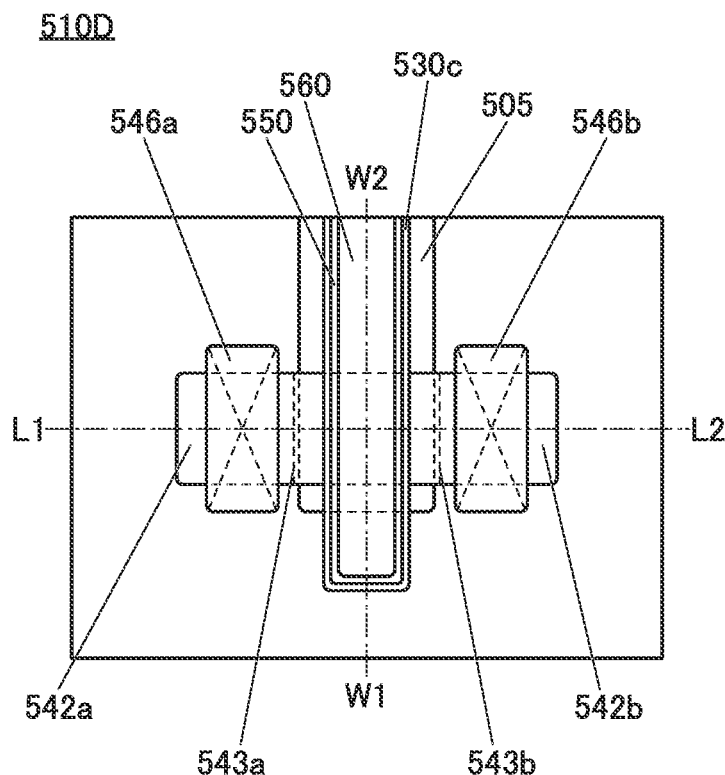
FIG. 12 (A) is a top view of a transistor, and (B) and (C) are cross-sectional views for explaining a structure example of the transistor.
Figure 12C:
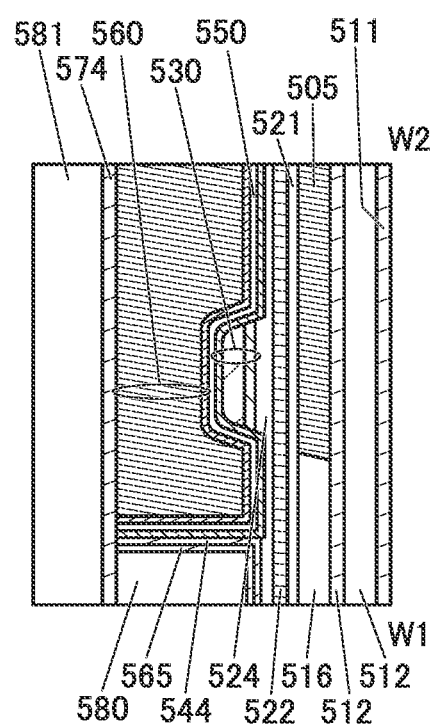
Figure 12B:
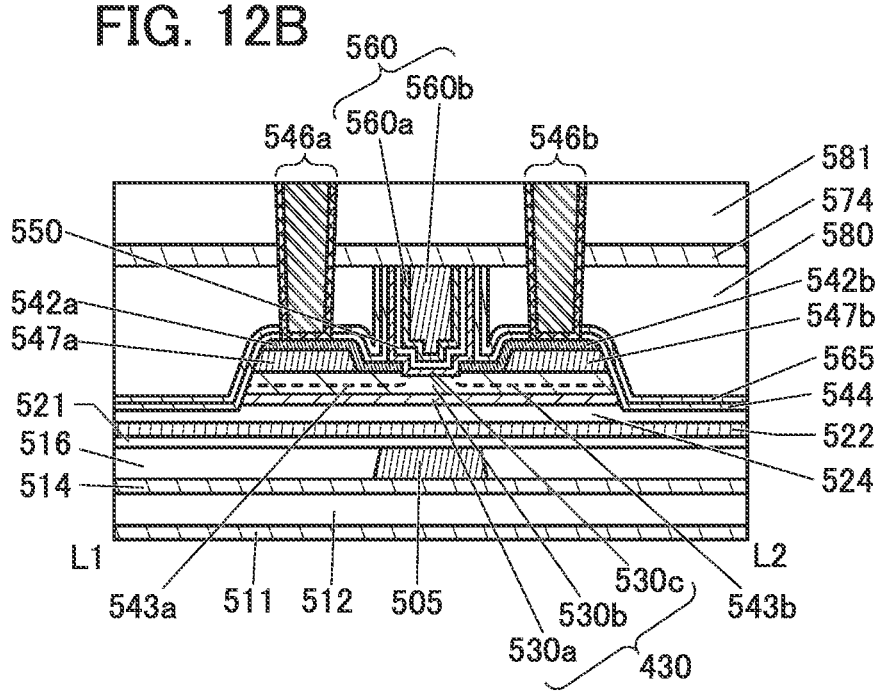

A structure example of a transistor 510D will be described with reference to FIGS. 12(A), 12(B), and 12(C). FIG. 12(A) is a top view of the transistor 510D. FIG. 12(B) is a cross-sectional view of a portion along the dashed-dotted line L1-L2 in FIG. 12(A). FIG. 12(C) is a cross-sectional view of a portion along the dashed-dotted line W1-W2 in FIG. 12(A). Note that for simplification of the drawing, some components are not illustrated in the top view in FIG. 12(A).

The transistor 510D is a variation example of the transistor 400. Therefore, differences from the transistor 400 are mainly described to avoid repeated description.

In the transistor 510D illustrated in FIG. 12, a conductive layer 547a is placed between the conductive layer 542a and the oxide 530b, and a conductive layer 547b is placed between the conductive layer 542b and the oxide 530b. Here, the conductive layer 542a (the conductive layer 542b) extends beyond the top surface and the side surface on the conductive layer 560 side of the conductive layer 547a (the conductive layer 547b), and includes a region in contact with the top surface of the oxide 530b. Here, for the conductive layer 547, a conductor that can be used for the conductive layer 542 is used. It is preferred that the thickness of the conductive layer 547 be at least greater than that of the conductive layer 542.

In the transistor 510D in FIG. 12 having such a structure, the conductive layer 542 can be closer to the conductive layer 560 than that in the transistor 400 is. Alternatively, an end portion of the conductive layer 542a and an end portion of the conductive layer 542b can overlap with the conductive layer 560. Accordingly, an effective channel length of the transistor 510D can be shortened; thus, the transistor 510D can have a high on-state current and improved frequency characteristics.

The conductive layer 547a (the conductive layer 547b) is preferably provided to overlap with the conductive layer 542a (the conductive layer 542b). With such a structure, the conductive layer 547a (the conductive layer 547b) functioning as a stopper can prevent over-etching of the oxide 530b by etching for forming the opening where the conductive layer 546a (the conductive layer 546b) is to be embedded.

In the transistor 510D illustrated in FIG. 12, the insulating layer 565 may be positioned on and in contact with the insulating layer 544. The insulating layer 544 preferably functions as a barrier insulating film that inhibits entry of impurities such as water and hydrogen and excess oxygen into the transistor 510D from the insulating layer 580 side. As the insulating layer 565, an insulating layer that can be used as the insulating layer 544 can be used. In addition, the insulating layer 544 may be formed using a nitride insulating material such as aluminum nitride, aluminum titanium nitride, titanium nitride, silicon nitride, or silicon nitride oxide, for example.

Unlike in the transistor 400 illustrated in FIG. 24, in the transistor 510D illustrated in FIG. 12, the conductive layer 505 may be provided to have a single-layer structure. In this case, an insulating film to be the insulating layer 516 is deposited over the patterned conductive layer 505, and an upper portion of the insulating film is removed by a CMP method or the like until the top surface of the conductive layer 505 is exposed. Preferably, the planarity of the top surface of the conductive layer 505 is made favorable. For example, the average surface roughness (Ra) of the top surface of the conductive layer 505 is less than or equal to 1 nm, preferably less than or equal to 0.5 nm, further preferably less than or equal to 0.3 nm. This allows the improvement in planarity of the insulating layer formed over the conductive layer 505 and the increase in crystallinity of the oxide 530b and the oxide 530c.

Transistor Structure Example 5

Figure 13A:
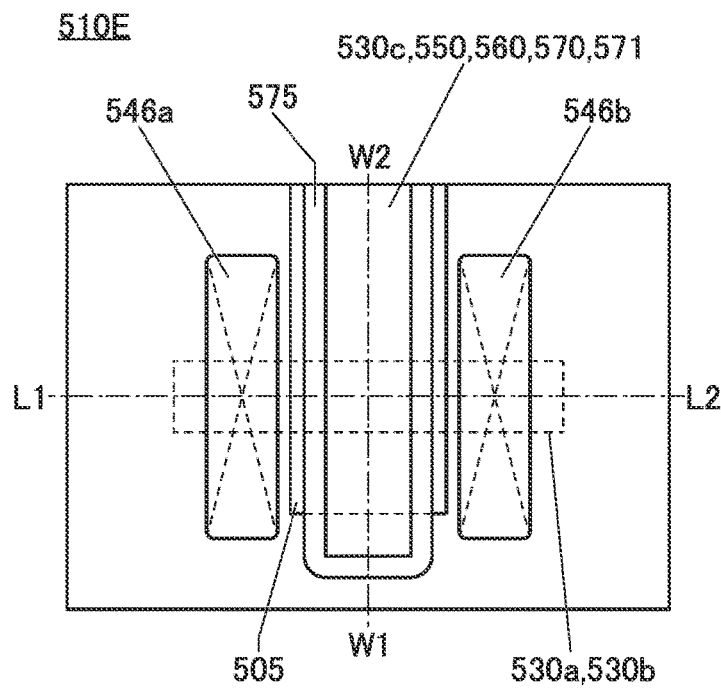
FIG. 13 (A) is a top view of a transistor, and (B) and (C) are cross-sectional views for explaining a structure example of the transistor.
Figure 13C:
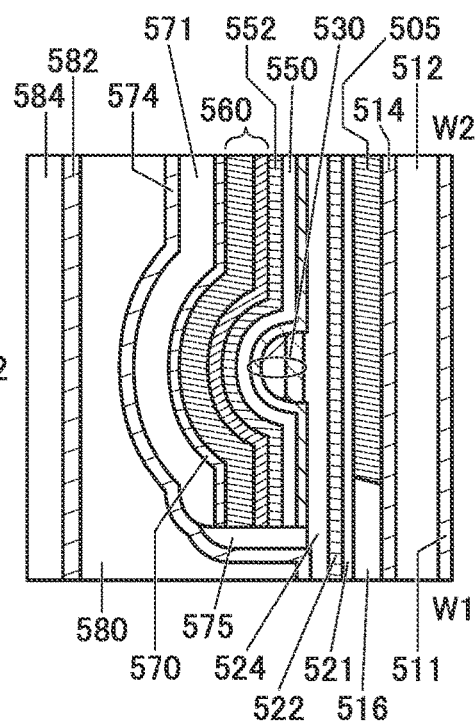
Figure 13B:
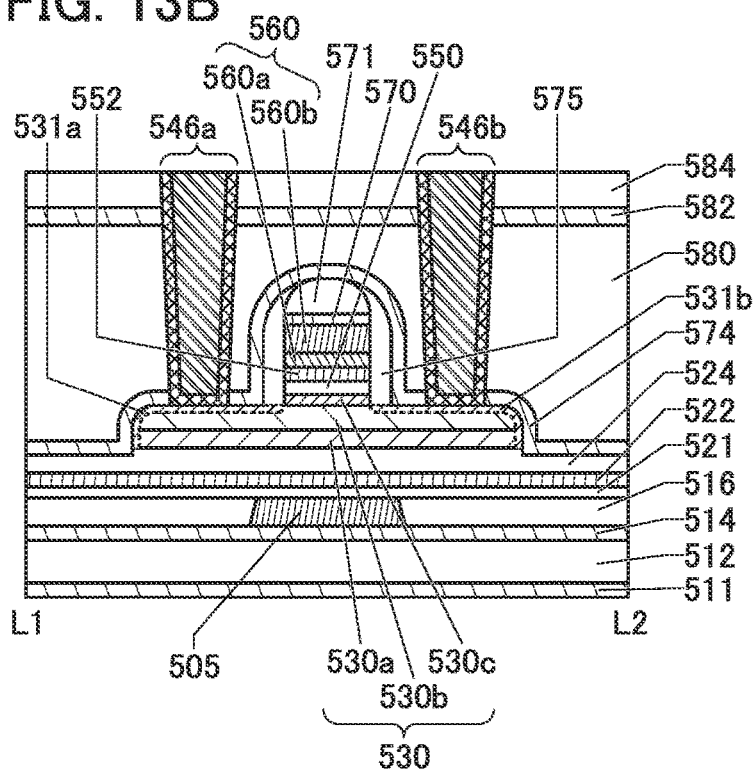

A structure example of a transistor 510E will be described with reference to FIGS. 13(A), 13(B), and 13(C). FIG. 13(A) is a top view of the transistor 510E. FIG. 13(B) is a cross-sectional view of a portion along the dashed-dotted line L1-L2 in FIG. 13(A). FIG. 13(C) is a cross-sectional view of a portion along the dashed-dotted line W1-W2 in FIG. 13(A). Note that for simplification of the drawing, some components are not illustrated in the top view of FIG. 13(A).

The transistor 510E is a variation example of the above transistor 400. Therefore, differences from the above transistor 400 are mainly described to avoid repeated description.

In FIG. 13(A) to FIG. 13(C), the conductive layer 503 is not provided and the conductive layer 505 functioning as the second gate also functions as a wiring. The insulating layer 550 is provided over the oxide 530c, and a metal oxide 552 is provided over the insulating layer 550. The conductive layer 560 is provided over the metal oxide 552, and an insulating layer 570 is provided over the conductive layer 560. An insulating layer 571 is provided over the insulating layer 570.

The metal oxide 552 preferably has a function of inhibiting diffusion of oxygen. When the metal oxide 552 that inhibits diffusion of oxygen is provided between the insulating layer 550 and the conductive layer 560, diffusion of the oxygen to the conductive layer 560 is inhibited. That is, a reduction in the amount of oxygen supplied to the oxide 530 can be inhibited. Moreover, oxidization of the conductive layer 560 due to oxygen can be inhibited.

Note that the metal oxide 552 may function as part of the first gate. For the metal oxide 552, the oxide semiconductor that can be used as the oxide 530 can be used, for example. In that case, when the conductive layer 560 is deposited by a sputtering method, the electric resistance of the metal oxide 552 is lowered so that the metal oxide 552 can become a conductive layer. This can be referred to as an OC (Oxide Conductor) electrode.

In addition, the metal oxide 552 functions as part of a gate insulating layer in some cases. Thus, when silicon oxide, silicon oxynitride, or the like is used for the insulating layer 550, a metal oxide that is a high-k material with a high dielectric constant is preferably used for the metal oxide 552. Such a stacked-layer structure can be thermally stable and can have a high dielectric constant. Thus, a gate potential that is applied during operation of the transistor can be reduced while the physical thickness is maintained. In addition, the equivalent oxide thickness (EOT) of the insulating layer functioning as the gate insulating layer can be reduced.

Although the metal oxide 552 in the transistor 510E is shown as a single layer, the metal oxide 552 may have a stacked-layer structure of two or more layers. For example, a metal oxide functioning as part of a gate electrode and a metal oxide functioning as part of the gate insulating layer may be stacked.

With the metal oxide 552 functioning as a gate electrode, the on-state current of the transistor 510E can be increased without a reduction in the influence of the electric field from the conductive layer 560. With the metal oxide 552 functioning as a gate insulating layer, the distance between the conductive layer 560 and the oxide 530 is kept by the physical thicknesses of the insulating layer 550 and the metal oxide 552, so that leakage current between the conductive layer 560 and the oxide 530 can be reduced. Thus, with the stacked-layer structure of the insulating layer 550 and the metal oxide 552, the physical distance between the conductive layer 560 and the oxide 530 and the intensity of electric field applied from the conductive layer 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable since it is less likely to be crystallized by heat treatment in a later step. Note that the metal oxide 552 is not an essential structure. Design is appropriately set in consideration of required transistor characteristics.

For the insulating layer 570, an insulating material having a function of inhibiting the passage of oxygen and impurities such as water and hydrogen is preferably used. For example, aluminum oxide or hafnium oxide is preferably used. Thus, oxidization of the conductive layer 560 due to oxygen from above the insulating layer 570 can be inhibited. Moreover, entry of impurities such as water and hydrogen from above the insulating layer 570 into an oxide 230 through the conductive layer 560 and the insulating layer 550 can be inhibited.

The insulating layer 571 functions as a hard mask. By providing the insulating layer 571, the conductive layer 560 can be processed to have a side surface that is substantially vertical; specifically, an angle formed by the side surface of the conductive layer 560 and a surface of the substrate can be greater than or equal to 75° and less than or equal to 100°, preferably greater than or equal to 80° and less than or equal to 95°.

An insulating material having a function of inhibiting the passage of oxygen and impurities such as water and hydrogen may be used for the insulating layer 571 so that the insulating layer 571 also functions as a barrier layer. In that case, the insulating layer 570 does not have to be provided.

Parts of the insulating layer 570, the conductive layer 560, the metal oxide 552, the insulating layer 550, and the oxide 530c are selected and removed using the insulating layer 571 as a hard mask, whereby their side surfaces can be substantially aligned with each other and a surface of the oxide 530b can be partly exposed.

The transistor 510E includes the region 531a and the region 531b on part of the exposed surface of the oxide 530b. One of the region 531a and the region 531b functions as a source region, and the other functions as a drain region.

The region 531a and the region 531b can be formed by addition of an impurity element such as phosphorus or boron to the exposed surface of the oxide 530b by an ion implantation method, an ion doping method, a plasma immersion ion implantation method, or plasma treatment, for example. In this embodiment and the like, an "impurity element" refers to an element other than main constituent elements.

Alternatively, the region 531a and the region 531b can be formed in such manner that, after part of the surface of the oxide 530b is exposed, a metal film is formed and then heat treatment is performed so that the element contained in the metal film is diffused into the oxide 530b.

The electrical resistivity of regions of the oxide 530b to which the impurity element is added decreases. For that reason, the region 531a and the region 531b are sometimes referred to as "impurity regions" or "low-resistance regions".

The region 531a and the region 531b can be formed in a self-aligned manner by using the insulating layer 571 and/or the conductive layer 560 as a mask. Accordingly, the conductive layer 560 does not overlap with the region 531a and/or the region 531b, so that the parasitic capacitance can be reduced. Moreover, an offset region is not formed between a channel formation region and the source/drain region (the region 531a or the region 531b). The formation of the region 531a and the region 531b in a self-aligned manner achieves an increase in on-state current, a reduction in threshold voltage, and an improvement in operating frequency, for example.

Note that an offset region may be provided between the channel formation region and the source/drain region in order to further reduce the off-state current. The offset region is a region where the electrical resistivity is high and a region where the above-described addition of the impurity element is not performed. The offset region can be formed by the above-described addition of the impurity element after the formation of an insulating layer 575. In this case, the insulating layer 575 serves as a mask like the insulating layer 571 or the like. Thus, the impurity element is not added to a region of the oxide 530b that overlaps with the insulating layer 575, so that the electrical resistivity of the region can be kept high.

The transistor 510E includes the insulating layer 575 on the side surfaces of the insulating layer 570, the conductive layer 560, the metal oxide 552, the insulating layer 550, and the oxide 530c. The insulating layer 575 is preferably an insulating layer having a low dielectric constant. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably used. In particular, silicon oxide, silicon oxynitride, silicon nitride oxide, or porous silicon oxide is preferably used for the insulating layer 575, in which case an excess-oxygen region can be easily formed in the insulating layer 575 in a later step. Silicon oxide and silicon oxynitride are preferable because of their thermal stability. The insulating layer 575 preferably has a function of diffusing oxygen.

The transistor 510E also includes the insulating layer 574 over the insulating layer 575 and the oxide 530. The insulating layer 574 is preferably deposited by a sputtering method. When a sputtering method is used, an insulating layer containing few impurities such as water and hydrogen can be deposited. For example, aluminum oxide is preferably used for the insulating layer 574.

Note that, in some cases, an oxide film formed by a sputtering method extracts hydrogen from the structure body over which the oxide film is deposited. Thus, the hydrogen concentration in the oxide 530 and the insulating layer 575 can be reduced when the insulating layer 574 absorbs hydrogen and water from the oxide 530 and the insulating layer 575.

This embodiment can be implemented in an appropriate combination with the structures described in the other embodiments and the like.

Embodiment 5

Figure 14A:
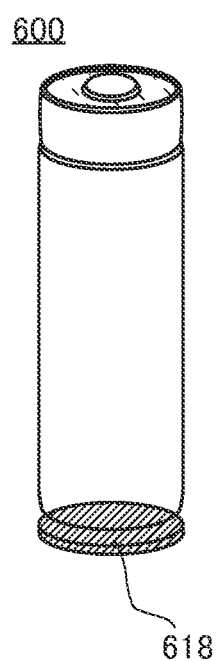
FIG. 14 (A) is a perspective view for explaining a cylindrical secondary battery, (B) is an exploded perspective view, and (C) is a diagram showing a protection circuit board.

In this embodiment, an example of a cylindrical secondary battery will be described with reference to FIG. 14. A cylindrical secondary battery 600 includes a positive electrode cap (battery lid) 601 on the top surface and a battery can (outer can) 602 on the side and bottom surfaces. The positive electrode cap and the battery can (outer can) 602 are insulated from each other by a gasket (insulating packing) 610. Furthermore, a protection circuit board 618 covered with a resin cover is electrically connected to the vicinity of a bottom surface of the battery can of the secondary battery 600.

Figure 14B:
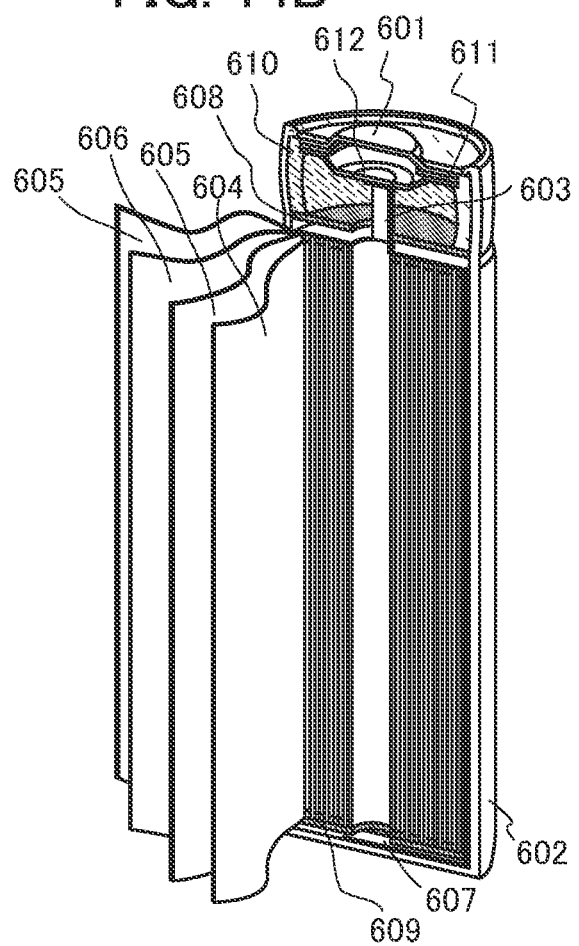
Figure 14C:
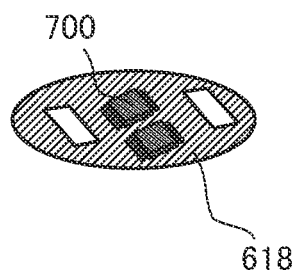

An electronic component 700 illustrated in FIG. 14(C) is an IC semiconductor device and includes a lead and a circuit portion. The circuit portion includes, for example, the protection circuit 100 described in Embodiment 1. The electronic component 700 is mounted on a printed board, for example. The protection circuit board 618 is a printed board on which one or more electronic components 700 are mounted.

FIG. 14(B) is a schematic cross-sectional view of the cylindrical secondary battery. Inside the battery can 602 having a hollow cylindrical shape, a battery element in which a strip-like positive electrode 604 and a strip-like negative electrode 606 are wound with a separator 605 located therebetween is provided. Although not illustrated, the battery element is wound around a center pin. One end of the battery can 602 is close and the other end thereof is open. For the battery can 602, a metal having a corrosion-resistant property to an electrolyte solution, such as nickel, aluminum, or titanium, an alloy of such a metal, or an alloy of such a metal and another metal (e.g., stainless steel) can be used. Alternatively, the positive electrode can 301 and the negative electrode can 302 are preferably covered with nickel, aluminum, or the like in order to prevent corrosion due to the electrolyte solution. Inside the battery can 602, the battery element in which the positive electrode, the negative electrode, and the separator are wound is provided between a pair of insulating plates 608 and 609 that face each other. Furthermore, a nonaqueous electrolyte solution (not illustrated) is injected inside the battery can 602 provided with the battery element. As the nonaqueous electrolyte solution, a nonaqueous electrolyte solution that is similar to that of the coin-type secondary battery can be used.

Since the positive electrode and the negative electrode of the cylindrical secondary battery are wound, active materials are preferably formed on both sides of the current collectors. A positive electrode terminal (positive electrode current collecting lead) 603 is connected to the positive electrode 604, and a negative electrode terminal (negative electrode current collecting lead) 607 is connected to the negative electrode 606. Both the positive electrode terminal 603 and the negative electrode terminal 607 can be formed using a metal material such as aluminum. The positive electrode terminal 603 and the negative electrode terminal 607 are resistance-welded to a safety valve mechanism 612 and the bottom of the battery can 602, respectively. The safety valve mechanism 612 is electrically connected to the positive electrode cap 601 through a positive temperature coefficient (PTC) element 611. The safety valve mechanism 612 cuts off electrical connection between the positive electrode cap 601 and the positive electrode 604 when the internal pressure of the battery exceeds a predetermined threshold value. The PTC element 611, which serves as a thermally sensitive resistor whose resistance increases as temperature rises, limits the amount of current by increasing the resistance, in order to prevent anomalous heat generation. Barium titanate ($BaTiO_3$)-based semiconductor ceramic or the like can be used for the PTC element.

[Structural Examples of Secondary Battery]

Other structural examples of secondary batteries will be described with reference to FIG. 15 to 18.

Figure 15A:
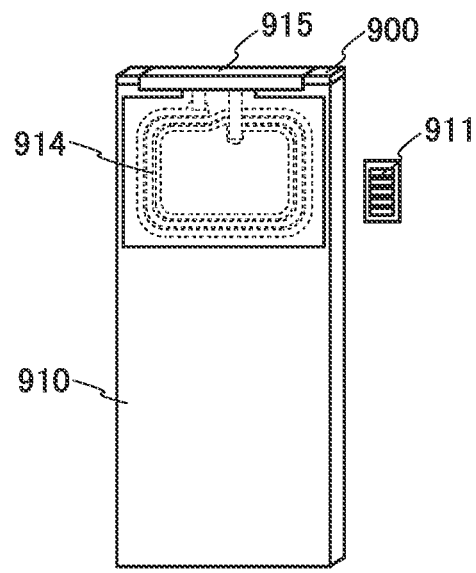
FIG. 15 (A) is a perspective view for explaining a secondary battery and (B) is an exploded perspective view.
Figure 15B:
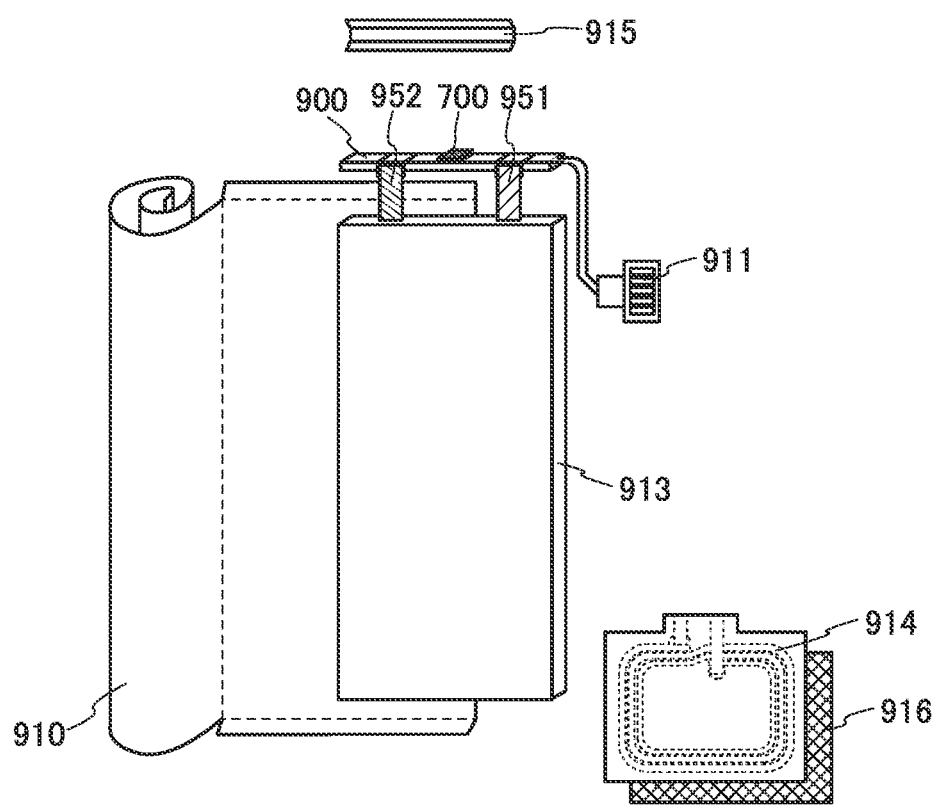

FIG. 15(A) and FIG. 15(B) are external views of a battery pack. The battery pack includes a circuit board 900 and a secondary battery 913. The secondary battery 913 includes a terminal 951 and a terminal 952 and is covered by a label 910. The battery pack may include an antenna 914. Contactless charging of the secondary battery 913 can also be performed using the antenna 914.

The circuit board 900 is fixed by a sealant 915. The electronic component 700 is mounted on the circuit board 900, and the circuit board 900 includes the protection circuit 100 described in Embodiment 1, for example. The terminal 911 is electrically connected to the terminal 951 and the terminal 952 of the secondary battery 913 through the circuit board 900. The terminal 911 is electrically connected to the antenna 914 and the electronic component 700 through the circuit board 900. Note that a plurality of terminals 911 may be provided so that each of the plurality of terminals 911 serves as a control signal input terminal, a power supply terminal, or the like.

The electronic component 700 detects an anomaly such as a micro short circuit. Furthermore, the electronic component 700 may serve as a protective circuit for protecting the secondary battery 913 from overcharge, overdischarge, and overcurrent. The electronic component 700 may be provided on the rear surface of the circuit board 900. Note that the shape of the antenna 914 is not limited to a coil shape and may be a linear shape or a plate shape. Further, a planar antenna, an aperture antenna, a traveling-wave antenna, an EH antenna, a magnetic-field antenna, or a dielectric antenna may be used. The antenna 914 has a function of communicating data with an external device, for example. As a system for communication using the antenna 914 between the battery pack and another device, a response method that can be used between the battery pack and another device, such as NFC, can be employed.

The battery pack includes a layer 916 between the secondary battery 913 and the antenna 914. The layer 916 has a function of blocking an electromagnetic field by the secondary battery 913, for example. As the layer 916, for example, a magnetic body can be used.

Note that the structure of the battery pack is not limited to that shown in FIG. 15.

For example, as shown in FIG. 16(A1) and FIG. 16(A2), another pair of opposite surfaces of the secondary battery 913 illustrated in FIG. 15(A) and FIG. 15(B) may be provided with an antenna 918. FIG. 16(A1) is an external view showing one side of the above pair of surfaces, and FIG. 16(A2) is an external view showing the other side of the above pair of surfaces. For portions similar to those illustrated in FIG. 15(A) and FIG. 15(B), descriptions of the battery pack illustrated in FIG. 15(A) and FIG. 15(B) can be referred to as appropriate.

As illustrated in FIG. 16(A1), the antenna 914 is provided on one of the pair of surfaces of the secondary battery 913 with the layer 916 located therebetween, and as illustrated in FIG. 16(A2), the antenna 918 is provided on the other of the pair of surfaces of the secondary battery 913 with a layer 917 located therebetween. The layer 917 has a function of blocking an electromagnetic field by the secondary battery 913, for example. As the layer 917, for example, a magnetic body can be used.

With the above structure, the battery pack can have two antennas and both the antenna 914 and the antenna 918 can be increased in size.

An antenna with a shape that can be applied to the antenna 914 can be used as the antenna 918. The antenna 918 may be a flat-plate conductor. The flat-plate conductor can serve as one of conductors for electric field coupling. That is, the antenna 914 can serve as one of two conductors of a capacitor. Thus, electric power can be transmitted and received not only by an electromagnetic field or a magnetic field but also by an electric field. Because a micro short circuit can be generated at the contactless charging, the protection circuit of above-described embodiment is preferably provided. A charge control circuit may be provided between these antennas and the secondary battery, and a protection circuit which is electrically connected to the secondary battery may be provided.

Alternatively, as illustrated in FIG. 16(B1), the battery pack illustrated in FIG. 15(A) and FIG. 15(B) may be provided with a display device 920. The display device 920 is electrically connected to the terminal 911. For portions similar to those illustrated in FIG. 15(A) and FIG. 15(B), descriptions of the battery pack illustrated in FIG. 15(A) and FIG. 15(B) can be referred to as appropriate.

The display device 920 can display, for example, an image showing whether charging is being carried out, an image showing a remaining capacity of the secondary battery, data that warns that an anomaly has been generated, or the like. As the display device 920, electronic paper, a liquid crystal display device, an electroluminescent (also referred to as "EL") display device, or the like can be used. For example, the use of electronic paper can reduce power consumption of the display device 920.

Alternatively, as illustrated in FIG. 16(B2), the secondary battery 913 illustrated in FIG. 15(A) and FIG. 15(B) may be provided with a sensor 921. The sensor 921 is electrically connected to the terminal 911 via a terminal 922 and the circuit board 900. Note that for portions which are the same as those of the secondary battery illustrated in FIG. 15(A) and FIG. 15(B), descriptions of the secondary battery illustrated in FIG. 15(A) and FIG. 15(B) can be referred to as appropriate.

The sensor 921 has a function of measuring, for example, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays. With the sensor 921, for example, data on an environment (e.g., temperature) where the secondary battery is placed can be determined and stored in a memory inside the electronic component 700. FIG. 16(C) is an example of a top view of the circuit board 900. A terminal 961 of the circuit board is connected to the terminal 951, and a terminal 962 is electrically connected to the terminal 952. The terminal 922 of the sensor 921 is electrically connected to a terminal 963 of the circuit board 900. When inputs from these terminals are input to the electronic component 700, an anomaly such as a micro short circuit can be detected on the basis of those data.

Furthermore, structural examples of the secondary battery 913 will be described with reference to FIG. 17 and FIG. 18.

Figure 17A:
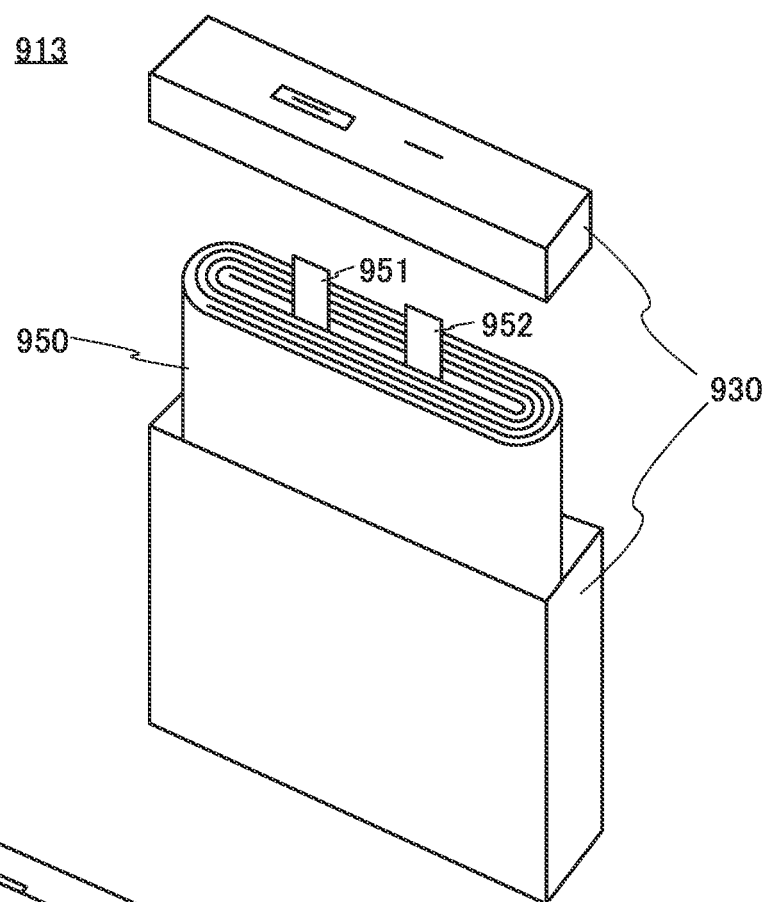
FIGS. 17 (A) and (B) are perspective views for explaining secondary batteries.

The secondary battery 913 illustrated in FIG. 17(A) includes a wound body 950 provided with the terminal 951 and the terminal 952 inside a housing 930. The wound body 950 is soaked in an electrolyte solution inside the housing 930. The terminal 952 is in contact with the housing 930. An insulator or the like inhibits contact between the terminal 951 and the housing 930. Note that in FIG. 17(A), the housing 930 divided into pieces is illustrated for convenience; however, in the actual structure, the wound body 950 is covered with the housing 930 and the terminals 951 and 952 extend to the outside of the housing 930. For the housing 930, a metal material (such as aluminum) or a resin material can be used.

Figure 17B:
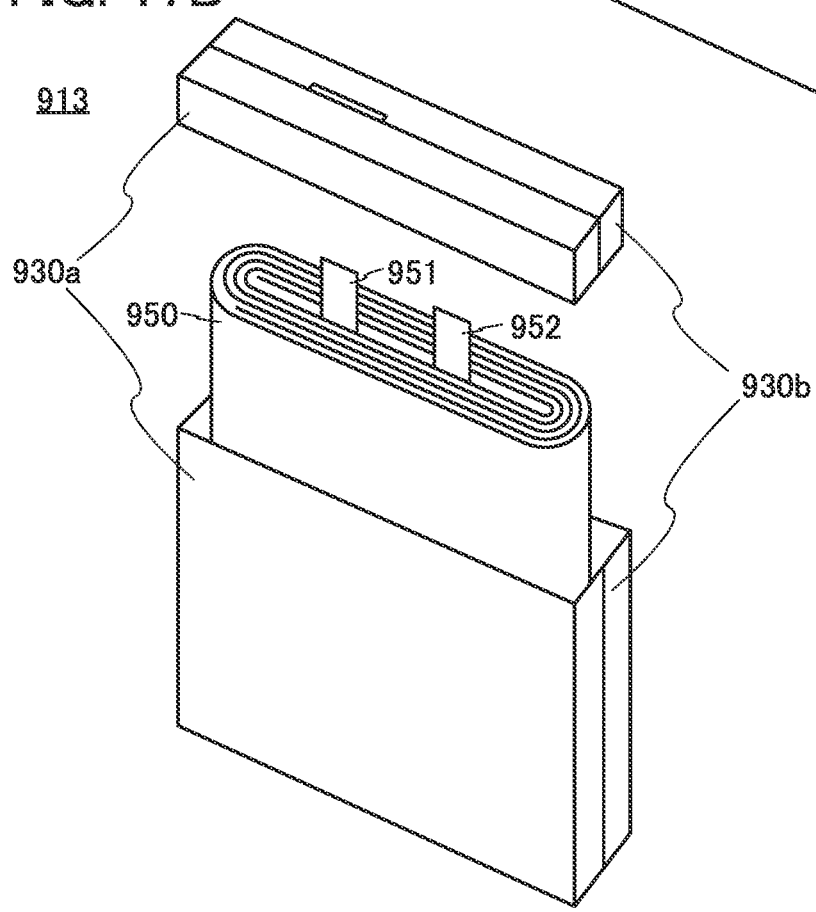

Note that as illustrated in FIG. 17(B), the housing 930 illustrated in FIG. 17(A) may be formed using a plurality of materials. For example, in the secondary battery 913 in FIG. 17(B), a housing 930a and a housing 930b are bonded to each other, and the wound body 950 is provided in a region surrounded by the housing 930a and the housing 930b.

For the housing 930a, an insulating material such as an organic resin can be used. In particular, when a material such as an organic resin is used for the side on which an antenna is formed, blocking of an electric field from the secondary battery 913 can be inhibited. When an electric field is not significantly blocked by the housing 930a, an antenna such as the antenna 914 may be provided inside the housing 930a. For the housing 930b, a metal material can be used, for example.

Figure 18:
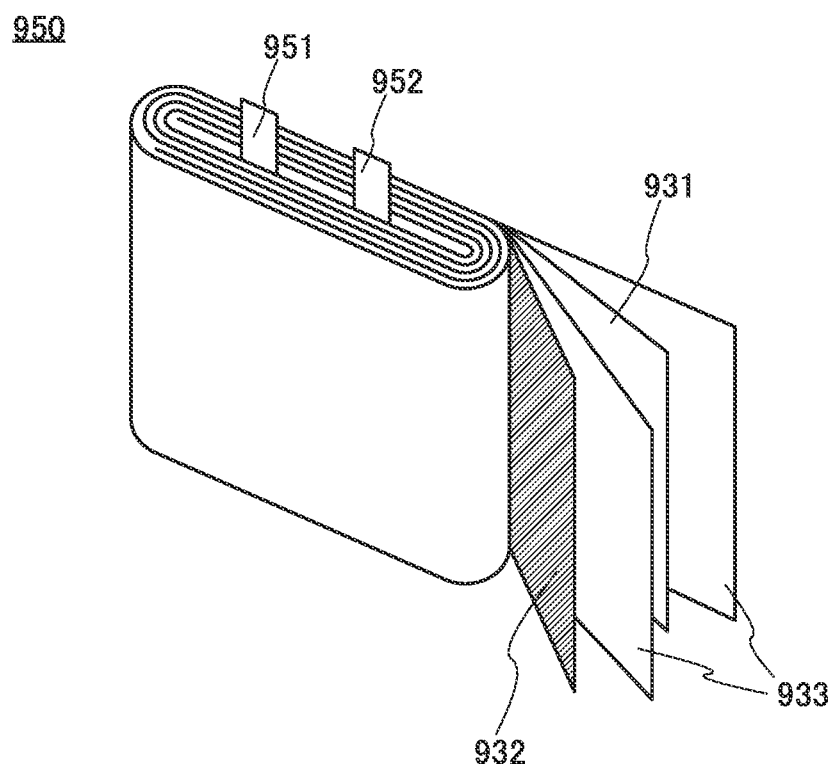
FIG. 18 A perspective view for explaining a secondary battery.

FIG. 18 illustrates the structure of the wound body 950. The wound body 950 includes a negative electrode 931, a positive electrode 932, and separators 933. The wound body 950 is obtained by winding a sheet of a stack in which the negative electrode 931 overlaps with the positive electrode 932 with the separator 933 provided therebetween. Note that a plurality of stacks each including the negative electrode 931, the positive electrode 932, and the separator 933 may be stacked.

The negative electrode 931 is connected to the terminal 911 illustrated in FIG. 15 via one of the terminal 951 and the terminal 952. The positive electrode 932 is connected to the terminal 911 in FIG. 15 via the other of the terminal 951 and the terminal 952.

The electronic component 700 is mounted on the circuit board 900 electrically connected to the terminal 952 and the terminal 911 illustrated in FIG. 15, and the circuit board 900 includes the protection circuit 100 described in Embodiment 1, for example. Therefore, the secondary battery 913 can have a high degree of safety.

Embodiment 6

In the example described in the above embodiment, one electronic component 700 is provided over a circuit board; without limitation, an electronic component 730 in which an interposer is provided over a package substrate (printed board) and a plurality of IC semiconductor devices are combined over the interposer may be used. The electronic component 700 or the electronic component 730 includes the protection circuit of the above embodiment, and detection of an anomaly, such as a micro short circuit, of a secondary battery is possible.

Figure 19:
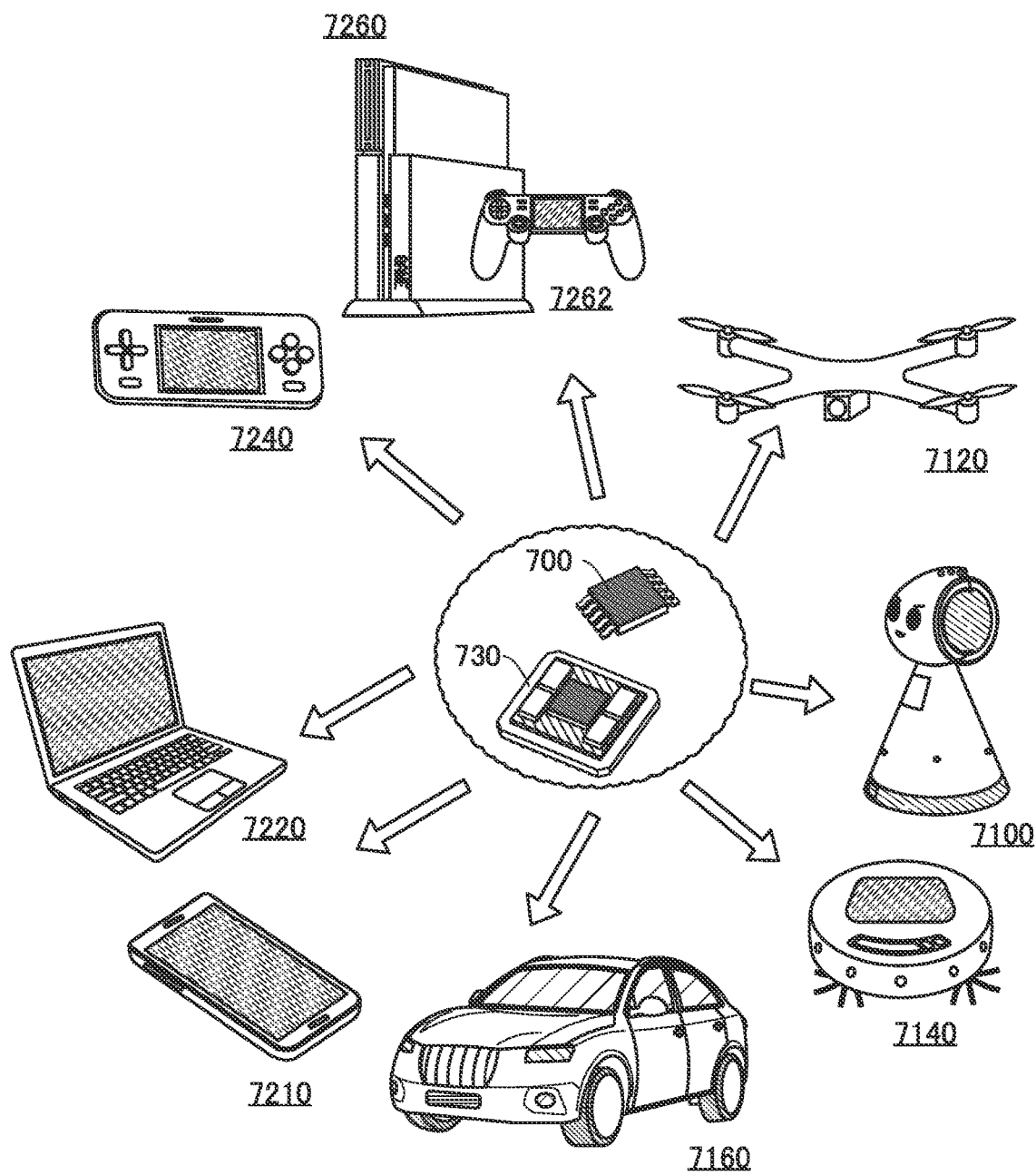
FIG. 19 A perspective view showing examples of electronic devices.

In this embodiment, examples of electronic devices equipped with a protection circuit are described with reference to FIG. 19.

A robot 7100 includes a secondary battery, an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The use of the protection circuit of one embodiment of the present invention for the secondary battery of the robot 7100 allows detection of an anomaly, such as a micro short circuit, of the secondary battery.

A microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. Furthermore, the robot 7100 has a function of moving with use of the moving mechanism. The robot 7100 can take images of the surroundings with use of the camera, and can analyze the images to sense whether there is an obstacle in the way of the movement.

A flying object 7120 includes propellers, a camera, a secondary battery, and the like and has a function of flying autonomously.

The use of the protection circuit of one embodiment of the present invention for the secondary battery of the flying object 7120 allows detection of an anomaly, such as a micro short circuit, of the secondary battery.

A cleaning robot 7140 includes a secondary battery, a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface. The use of the protection circuit of one embodiment of the present invention which is electrically connected to the secondary battery of the cleaning robot 7140 allows detection of an anomaly, such as a micro short circuit, of the secondary battery.

An electric vehicle 7160 is shown as an example of a moving object. The electric vehicle 7160 includes a secondary battery, tires, a brake, a steering gear, a camera, and the like. The use of the protection circuit of one embodiment of the present invention which is electrically connected to the secondary battery of the electric vehicle 7160 allows detection of an anomaly, such as a micro short circuit, of the secondary battery.

Note that although an electric vehicle is described above as an example of a moving object, the moving object is not limited to an electric vehicle. Examples of the moving object include a train, a monorail train, a ship, a flying object (a helicopter, an unmanned aircraft (a drone), an airplane, and a rocket), and the like, and these moving objects. The use of the protection circuit of one embodiment of the present invention which is electrically connected to secondary batteries of these moving objects allows detection of an anomaly, such as a micro short circuit, of the secondary batteries.

The electronic component 700 and/or the electronic component 730 can be incorporated in a smartphone 7210, a PC 7220 (personal computer), a game machine 7240, and the like.

The smartphone 7210 is an example of a portable information terminal. The smartphone 7210 includes a microphone, a camera, a speaker, various kinds of sensors, and a display portion. These peripheral devices are controlled by the electronic component 730. The use of the protection circuit of one embodiment of the present invention which is electrically connected to the secondary battery of the smartphone 7210 allows detection of an anomaly, such as a micro short circuit, of the secondary battery and increases safety.

The PC 7220 is an example of a notebook PC. The use of the protection circuit of one embodiment of the present invention which is electrically connected to the secondary battery of the notebook PC allows detection of an anomaly, such as a micro short circuit, of the secondary battery and increases safety.

The game machine 7240 is an example of a portable game machine. The game machine 7260 is an example of a home-use stationary game machine. To the game machine 7260, a controller 7262 is connected with or without a wire.

The incorporation of the electronic component 700 and/or the electronic component 730 in the controller 7262 allows detection of an anomaly, such as a micro short circuit, of the secondary battery.

This embodiment can be implemented in an appropriate combination with the structures described in the other embodiments and the like.

Embodiment 7

Figure 20:
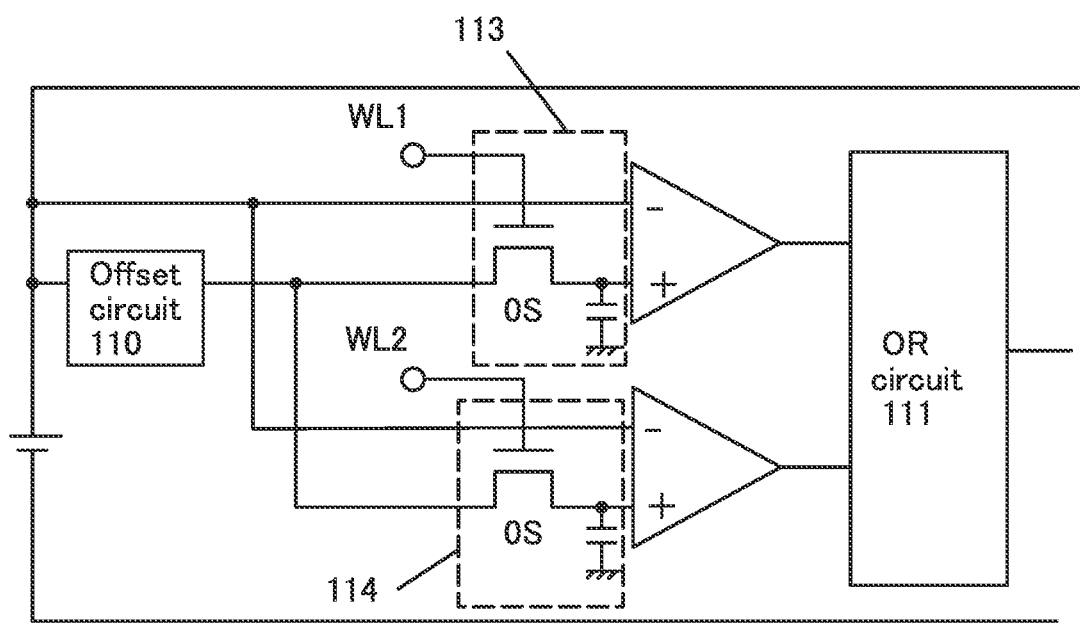
FIG. 20 An example of a block diagram showing one embodiment of the present invention.

FIG. 20 shows an example of a block diagram of a protection circuit which performs anomaly detection on a secondary battery.

As illustrated in FIG. 20, the secondary battery protection circuit includes at least a first comparison circuit, a first memory 113, a second comparison circuit, a second memory 114, an offset circuit 110, and an OR circuit 111.

A lithium-ion secondary battery is used as the secondary battery. In a lithium-ion secondary battery, deterioration is promoted if charging or discharging is performed excessively. Accordingly, in order to prevent overcharging and overdischarging, the condition at charging and discharging is controlled with a control circuit or the like so that the charging rate of a lithium-ion secondary battery can be within a certain range (for example, charging rate of 20% to 80% of the theoretical capacity, which is regarded as the maximum capacity here).

The first and second comparison circuits compare two input voltages in size and produce output. As the first and second comparison circuits, single-polarity circuits using a transistor that includes an oxide semiconductor in its channel formation region can also be used.

The first memory electrically connected to the first comparison circuit is an analog memory and stores an analog potential of a secondary battery, which is offset by the offset circuit 110. The data of the offset voltage value of the secondary battery is created by application of a write signal to a gate of a transistor of the first memory with the use of parasitic capacitance between the gate electrode and a drain electrode. The first memory is formed of one transistor including an oxide semiconductor in its channel formation region and a capacitor. The first memory can also be referred to as a high-accuracy charging voltage monitor circuit. Furthermore, the first memory can take advantage of the low leakage current of the transistor including an oxide semiconductor in its channel formation region.

Figure 21:
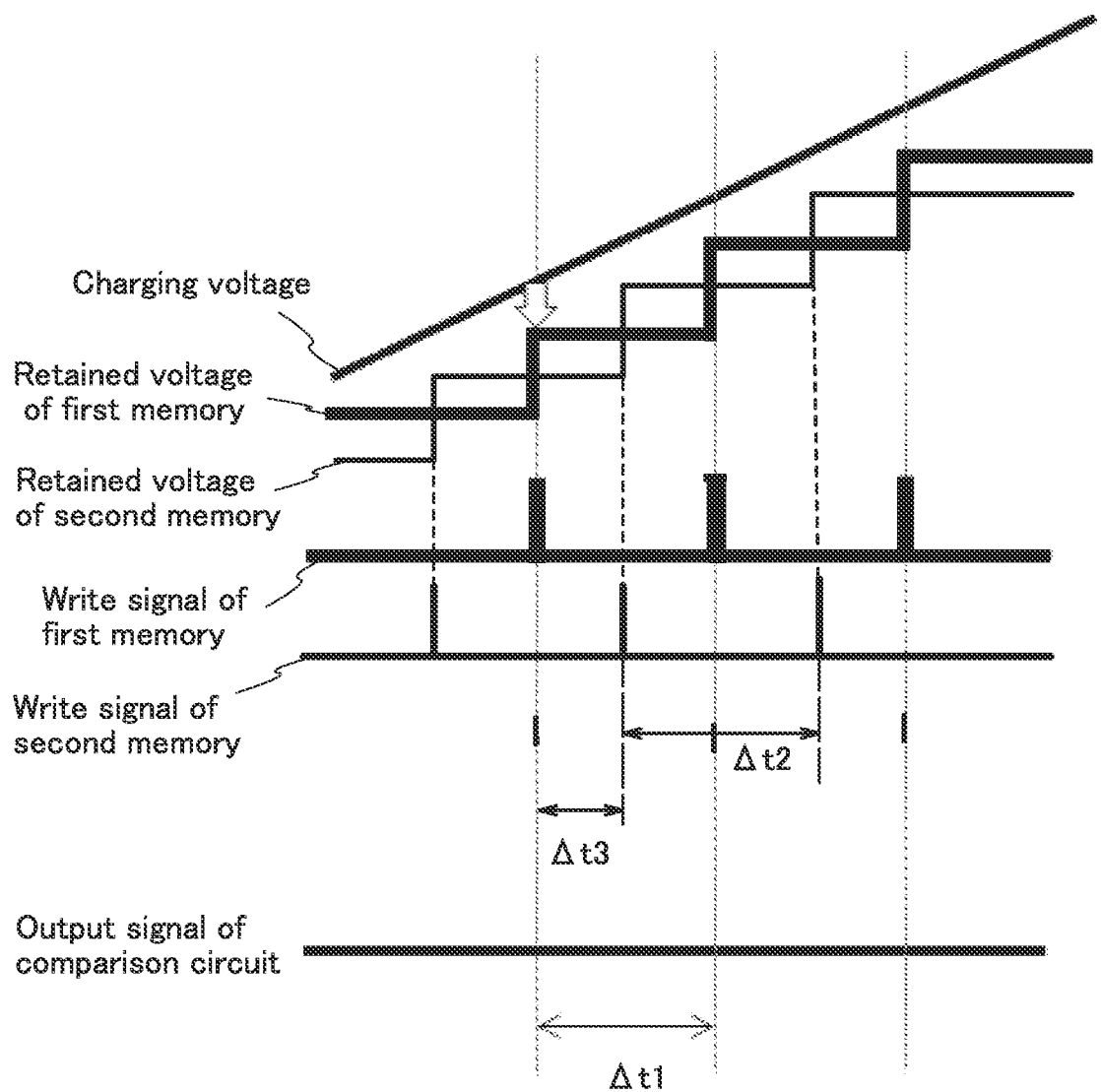
FIG. 21 An example of a timing chart showing one embodiment of the present invention.

Furthermore, FIG. 21 shows an example of a timing chart in normal operation for the case where the first and second comparison circuits are used.

The second memory electrically connected to the second comparison circuit has the same element structure as the first memory and is formed of one transistor including an oxide semiconductor in its channel formation region and a capacitor.

A period $\Delta t1$ in FIG. 21 represents a sampling period of the first memory. In FIG. 21, sampling is performed three times, and every sampling operation is performed normally. Furthermore, a period $\Delta t2$ in FIG. 21 represents a sampling period of the second memory. In FIG. 21, sampling is performed three times, and every sampling operation is performed normally. In the example, a write signal of the first memory and a write signal of the second memory have a gap of a period $\Delta t3$ therebetween and are used alternately for sampling of the secondary battery; consequently, sampling is performed six times in total.

Figure 22:
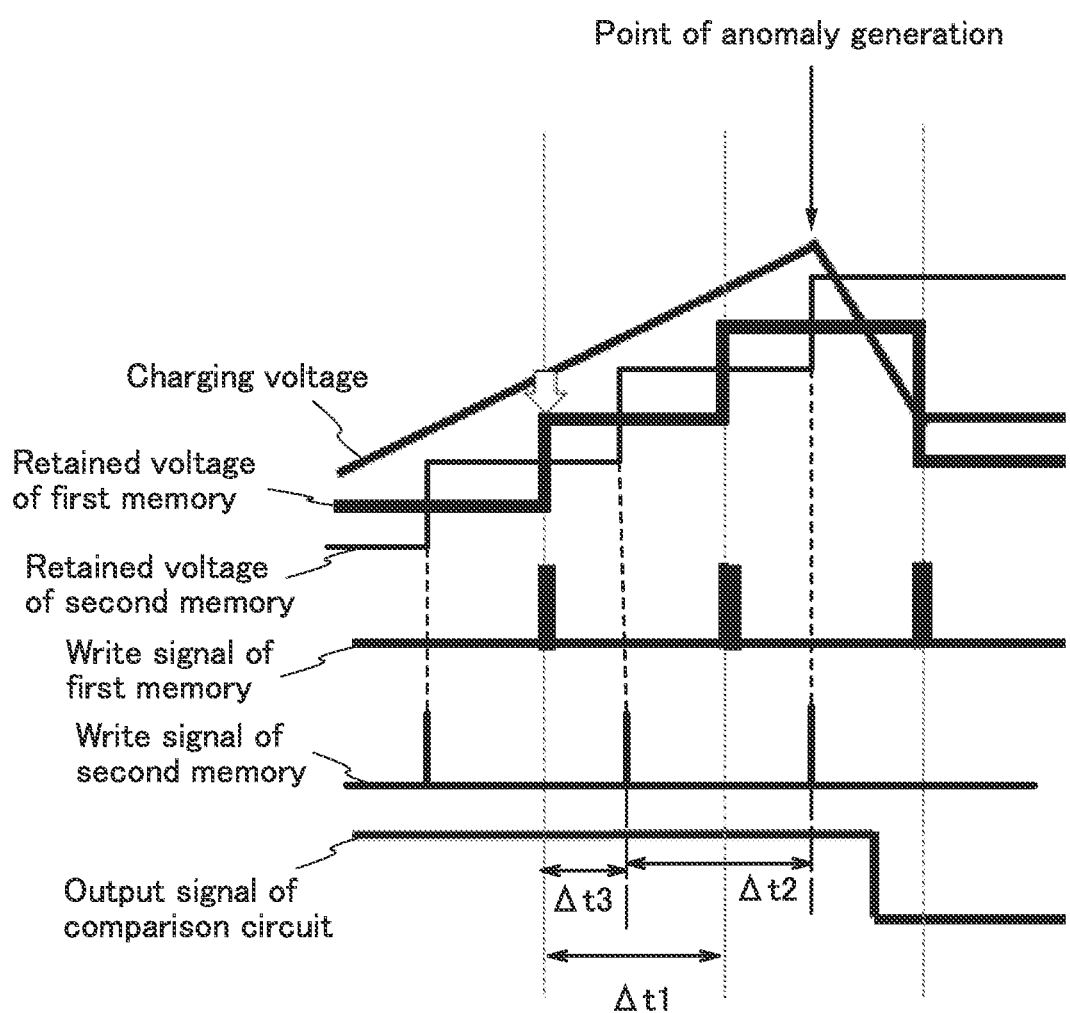
FIG. 22 An example of a timing chart showing one embodiment of the present invention.

FIG. 22 shows an example of a timing chart of the time when an anomaly is generated.

When an anomaly such as a micro short circuit is generated, the charging voltage of the secondary battery drops suddenly, and anomaly current flows inside the battery through a path where the protection circuit does not exist (inside the battery). In FIG. 22, the point at which the charging voltage suddenly falls is the point of anomaly generation. In FIG. 22, sampling is performed six times; the first to fifth samplings are performed normally, and the sixth sampling is performed with an anomaly. At the sixth sampling (writing of the memory), the output signal of the first comparison circuit is inverted and an anomaly behavior can be detected.

The inverted output signal of the first comparison circuit is input to the OR circuit 111, and anomaly judgement can be performed based on the output from the OR circuit 111.

Figure 23:
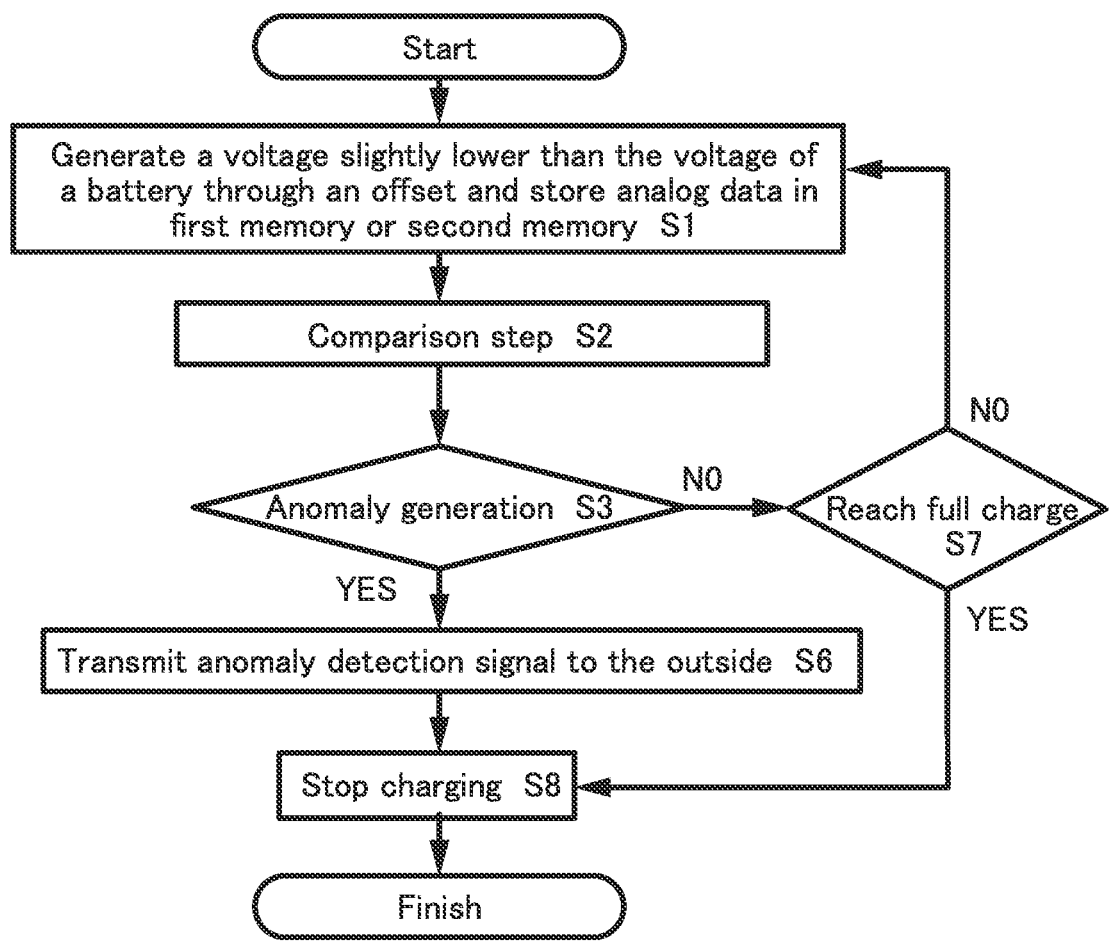
FIG. 23 An example of a flow chart showing one embodiment of the present invention.

FIG. 23 shows an example of a flow for the case where anomaly detection is performed on a mobile device equipped with a secondary battery a plurality of times in one charging operation.

First, voltage value data of a secondary battery is acquired with a voltage value acquisition means such as a voltage monitor. Then, the offset voltage data of the secondary battery (analog data) is written to the first memory circuit or the second memory circuit every sampling period Δt (S1). Writing is performed alternately with an interval therebetween.

Next, voltage values measured at the present time and a different time are compared (comparison step: S2). In the case where the comparison result indicates that the difference between the two input voltages is small, the above-described data acquisition and comparison repeat. When charging continues without any detection of an anomaly and reaches full charge (S7), charging stops (S8).

In the case where the difference between the two input voltages is large in the comparison step S2, it is judged that an anomaly is generated (S3) and a signal output from the OR circuit (e.g., a CPU of a mobile device) is transmitted to the outside as an anomaly detection signal (S6). Then, on the instructions of the outside, charging stops (S8).

Using the circuit configuration shown in FIG. 20 and following the flow shown in FIG. 23, a secondary battery where an anomaly has been generated can be prevented from being charged continuously and firing of the battery can be avoided.

Since two anomaly detection circuits are alternately used in the circuit configuration shown in FIG. 20, real-time detection of a micro short circuit is possible. For example, when the period Δt is 1 second, in the case where two anomaly detection circuits are alternately used, the circuit configuration shown in FIG. 20 performs driving for anomaly detection every 0.5 seconds.

Furthermore, even in the case where generation of a micro short circuit and sampling overlap, detection is possible. Moreover, in some cases, the operation returns to normal after a micro short circuit is generated; for such a case, detection is desired to be performed before the operation returns to normal. Since the circuit configuration shown in FIG. 20 has two systems and thus the detection probability increases, it can be said that high-accuracy detection is possible. Furthermore, three or more systems may be included. Since a transistor including an oxide semiconductor is used, even when the number of systems is increased, power consumption and leakage current can be reduced.

This embodiment can be implemented in an appropriate combination with the structures described in the other embodiments and the like.

REFERENCE NUMERALS

10: memory cell, 100: protection circuit, 101: secondary battery, 102: comparison circuit, 103: memory, 104: memory, 105: power-off switch, 110: offset circuit, 111: OR circuit, 113: first memory, 114: second memory, 230: oxide, 503: conductive layer, 505: conductive layer, 505a: conductive layer, 505b: conductive layer, 510B: transistor, 510C: transistor, 510D: transistor, 510E: transistor, 511: insulating layer, 512: insulating layer, 514: insulating layer, 516: insulating layer, 521: insulating layer, 522: insulating layer, 524: insulating layer, 530: oxide, 530a: oxide, 530b: oxide, 530c: oxide, 531: region, 531a: region, 531b: region, 542: conductive layer, 542a: conductive layer, 542b: conductive layer, 544: insulating layer, 546: conductive layer, 546a: conductive layer, 546b: conductive layer, 547: conductive layer, 547a: conductive layer, 547b: conductive layer, 550: insulating layer, 551: oxide, 552: metal oxide, 560: conductive layer, 560a: conductive layer, 560b: conductive layer, 565: insulating layer, 570: insulating layer, 571: insulating layer, 573: insulating layer, 574: insulating layer, 575: insulating layer, 576: insulating layer, 576a: insulating layer, 576b: insulating layer, 580: insulating layer, 582: insulating layer, 584: insulating layer, 600: secondary battery, 601: positive electrode cap, 602: battery can, 603: positive electrode terminal, 604: positive electrode, 605: separator, 606: negative electrode, 607: negative electrode terminal, 608: insulating plate, 609: insulating plate, 611: PTC element, 612: safety valve mechanism, 618: protection circuit board, 700: electronic component, 730: electronic component, 900: circuit board, 910: label, 911: terminal, 913: secondary battery, 914: antenna, 915: sealant, 916: layer, 917: layer, 918: antenna, 920: display device, 921: sensor, 922: terminal, 930: housing, 930a: housing, 930b: housing, 931: negative electrode, 932: positive electrode, 933: separator, 950: wound body, 951: terminal, 952: terminal, 961: terminal, 962: terminal, 963: terminal, 7100: robot, 7120: flying object, 7140: cleaning robot, 7160: electric vehicle, 7210: smartphone, 7220: PC, 7240: game machine, 7260: game machine, 7262: controller, 7300: cleaning robot

The invention claimed is:

1. A secondary battery protection circuit comprising:
   a first memory circuit electrically connected to a secondary battery;
   a comparison circuit electrically connected to the first memory circuit;
   a second memory circuit electrically connected to the comparison circuit; and
   a power-off switch electrically connected to the second memory circuit,
   wherein the power-off switch is electrically connected to the secondary battery,
   wherein the first memory circuit comprises a first transistor comprising an oxide semiconductor, and
   wherein the first transistor is configured to retain a voltage value of the secondary battery in an analog manner.

2. The secondary battery protection circuit according to claim 1,
   wherein the second memory circuit comprises a second transistor comprising an oxide semiconductor, and
   wherein the second transistor is configured to retain data of the power-off switch.

3. The secondary battery protection circuit according to claim 1,
   wherein the comparison circuit is electrically connected to the secondary battery, and when a voltage drop of the secondary battery occurs, an output signal of the comparison circuit is inverted, an anomaly is detected, and the power-off switch is brought into an off state.

4. The secondary battery protection circuit according to claim 1,
wherein the first memory circuit is subjected to writing every period Δt and the comparison circuit compares a voltage value of the secondary battery and a value retained in the first memory circuit.

5. The secondary battery protection circuit accord according to claim 1,
wherein the oxide semiconductor comprises any one of indium, gallium, and zinc.

6. A secondary battery anomaly detection system comprising the secondary battery protection circuit according to claim 1:
wherein the first memory circuit retains an offset voltage value of the secondary battery,
wherein a warning of an anomaly is given to a user at a point in time when the voltage value of the secondary battery becomes largely different from the offset voltage value of the secondary battery.

7. A secondary battery anomaly detection system comprising the secondary battery protection circuit according to claim 1:
wherein the first memory circuit retains an offset voltage value of the secondary battery,
wherein charging stops at a point in time when the voltage value of the secondary battery becomes largely different from the offset voltage value of the secondary battery.

8. A secondary battery anomaly detection system comprising the secondary battery protection circuit according to claim 1:
wherein the first memory circuit retains an offset voltage value of the secondary battery,
wherein a charging condition is changed in accordance with the number of times or the strength of an anomaly point where the voltage value of the secondary battery becomes largely different from the offset voltage value of the secondary battery.

9. A secondary battery protection circuit comprising:
a first comparison circuit electrically connected to a first memory circuit;
a second memory circuit electrically connected to a secondary battery;
a second comparison circuit electrically connected to the second memory circuit; and
an OR circuit to which an output of the first comparison circuit and an output of the second comparison circuit are each input,
wherein the first memory circuit comprises a first transistor comprising an oxide semiconductor,
wherein the first transistor is configured to retain a voltage value of the secondary battery in an analog manner,
wherein the second memory circuit comprises a second transistor comprising an oxide semiconductor, and
wherein the second transistor is configured to retain a voltage value of the secondary battery in an analog manner with a timing different from that of the first memory circuit.

10. The secondary battery protection circuit according to claim 9,
wherein the oxide semiconductor includes any one of indium, gallium, and zinc.

11. A secondary battery anomaly detection system comprising the secondary battery protection circuit according to claim 9:
wherein one of the first memory circuit and the second memory circuit retains an offset voltage value of the secondary battery,
wherein a warning of an anomaly is given to a user at a point in time when the voltage value of the secondary battery becomes largely different from the offset voltage value of the secondary battery.

12. A secondary battery anomaly detection system comprising the secondary battery protection circuit according to claim 9:
wherein one of the first memory circuit and the second memory circuit retains an offset voltage value of the secondary battery,
wherein charging stops at a point in time when the voltage value of the secondary battery becomes largely different from the offset voltage value of the secondary battery.

13. A secondary battery anomaly detection system comprising the secondary battery protection circuit according to claim 9:
wherein one of the first memory circuit and the second memory circuit retains an offset voltage value of the secondary battery,
wherein a charging condition is changed in accordance with the number of times or the strength of an anomaly point where the voltage value of the secondary battery becomes largely different from the offset voltage value of the secondary battery.

* * * * *